US011775013B2

(12) United States Patent
Cho et al.

(10) Patent No.: US 11,775,013 B2
(45) Date of Patent: Oct. 3, 2023

(54) FLEXIBLE DISPLAY AND ELECTRONIC DEVICE HAVING SAME

(71) Applicant: Samsung Electronics Co., Ltd., Gyeonggi-do (KR)

(72) Inventors: Joungmin Cho, Gyeonggi-do (KR); Seunghoon Ko, Gyeonggi-do (KR); Gidae Kim, Gyeonggi-do (KR); Jungchul An, Gyeonggi-do (KR); Kwangtai Kim, Gyeonggi-do (KR); Hyungsup Byeon, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 37 days.

(21) Appl. No.: 16/976,877

(22) PCT Filed: Mar. 8, 2019

(86) PCT No.: PCT/KR2019/002731
§ 371 (c)(1),
(2) Date: Aug. 31, 2020

(87) PCT Pub. No.: WO2019/172709
PCT Pub. Date: Sep. 12, 2019

(65) Prior Publication Data
US 2020/0409421 A1   Dec. 31, 2020

(30) Foreign Application Priority Data

Mar. 8, 2018   (KR) .......................... 10-2018-0027647

(51) Int. Cl.
*G06F 1/16*   (2006.01)
*H04M 1/02*   (2006.01)
(Continued)

(52) U.S. Cl.
CPC .......... *G06F 1/1652* (2013.01); *G06F 1/1643* (2013.01); *H04M 1/0268* (2013.01);
(Continued)

(58) Field of Classification Search
CPC ............................ G06F 1/1652; G06F 1/1643
See application file for complete search history.

(56) References Cited

U.S. PATENT DOCUMENTS 8,711,566 B2   4/2014   O'Brien
9,177,904 B2   11/2015   Jung et al.
(Continued)

FOREIGN PATENT DOCUMENTS

CN   102902308 A   1/2013
CN   203759584 U   8/2014
(Continued)

OTHER PUBLICATIONS

European Search Report dated Mar. 17, 2021.
Office Action dated Mar. 24, 2022.

*Primary Examiner* — Abhishek M Rathod
(74) *Attorney, Agent, or Firm* — Cha & Reiter, LLC

(57) ABSTRACT

An electronic device is provided. The electronic device includes a flexible display including a plurality of layers and a support member having the flexible display mounted thereon. The flexible display includes a first region having a first flexibility and a second region having a second flexibility different from the first flexibility and extending from the first region in a first direction. At least one of the plurality of layers has a first structure in the first region and has a second structure different from the first structure in the second region. The support member includes a first portion that supports the first region such that at least part of the first
(Continued)

region remains flat and a second portion that supports the second region such that at least part of the second region is bent and then unfolded.

15 Claims, 16 Drawing Sheets

(51) Int. Cl.
  *H10K 50/84* (2023.01)
  *H10K 59/40* (2023.01)
  *H10K 102/00* (2023.01)

(52) U.S. Cl.
  CPC ............ *H10K 50/84* (2023.02); *H10K 59/40* (2023.02); *H10K 2102/311* (2023.02)

(56) References Cited

U.S. PATENT DOCUMENTS

| | | | |
|---|---|---|---|
| 9,195,272 | B2 | 11/2015 | O'Brien |
| 9,490,312 | B2 | 11/2016 | Lee et al. |
| 9,614,168 | B2 | 4/2017 | Zhang et al. |
| 9,681,538 | B2 | 6/2017 | Ahn |
| 9,818,732 | B2 | 11/2017 | Jung et al. |
| 9,836,148 | B2 | 12/2017 | Kim et al. |
| 10,488,957 | B2 | 11/2019 | Kim et al. |
| 10,881,009 | B2 * | 12/2020 | Jiang .................... H05K 5/0017 |
| 2012/0212433 | A1 * | 8/2012 | Lee ....................... G06F 1/1652 345/173 |
| 2012/0314400 | A1 * | 12/2012 | Bohn .................... G06F 1/1652 362/97.1 |
| 2013/0058063 | A1 * | 3/2013 | O'Brien ................ G06F 1/1652 361/807 |
| 2013/0293816 | A1 | 11/2013 | Jung et al. |
| 2015/0029683 | A1 * | 1/2015 | Kim ..................... H01L 51/0097 361/749 |
| 2015/0266272 | A1 * | 9/2015 | Lee ......................... B32B 17/10 428/189 |
| 2016/0020196 | A1 | 1/2016 | Jung et al. |
| 2016/0181345 | A1 | 6/2016 | Lee et al. |
| 2016/0202781 | A1 | 7/2016 | Kim et al. |
| 2016/0204366 | A1 | 7/2016 | Zhang et al. |
| 2016/0250827 | A1 * | 9/2016 | Jung ....................... B32B 27/16 428/446 |
| 2016/0357052 | A1 * | 12/2016 | Kim ....................... G06F 1/1652 |
| 2016/0374228 | A1 * | 12/2016 | Park ....................... G09F 9/301 |
| 2016/0380033 | A1 | 12/2016 | Lee |
| 2017/0064847 | A1 * | 3/2017 | Lim ......................... G09F 9/00 |
| 2017/0222178 | A1 | 8/2017 | Kang et al. |
| 2017/0263873 | A1 | 9/2017 | Zhang et al. |
| 2017/0287992 | A1 | 10/2017 | Kwak et al. |
| 2018/0014417 | A1 * | 1/2018 | Seo ....................... H05K 1/0281 |
| 2018/0088695 | A1 | 3/2018 | Kim et al. |
| 2018/0190936 | A1 * | 7/2018 | Lee ..................... H01L 51/5237 |
| 2018/0293936 | A1 * | 10/2018 | Fujioka ................ G09G 3/3208 |
| 2020/0253063 | A1 * | 8/2020 | Jiang .................... H04M 1/0268 |
| 2020/0258957 | A1 | 8/2020 | Kwak et al. |

FOREIGN PATENT DOCUMENTS

| | | |
|---|---|---|
| CN | 105609001 A | 5/2016 |
| CN | 105788460 A | 7/2016 |
| CN | 107112348 A | 8/2017 |
| CN | 107241465 A | 10/2017 |
| CN | 107424518 A | 12/2017 |
| EP | 3021192 A | 5/2016 |
| KR | 10-2016-0087460 A | 7/2016 |
| KR | 10-2017-0095280 A | 8/2017 |
| KR | 10-2017-0095846 A | 8/2017 |
| KR | 10-2017-0136033 A | 12/2017 |
| WO | WO-2018153165 A1 * | 8/2018 ........... G06F 1/1624 |

* cited by examiner

【Figure 1a】
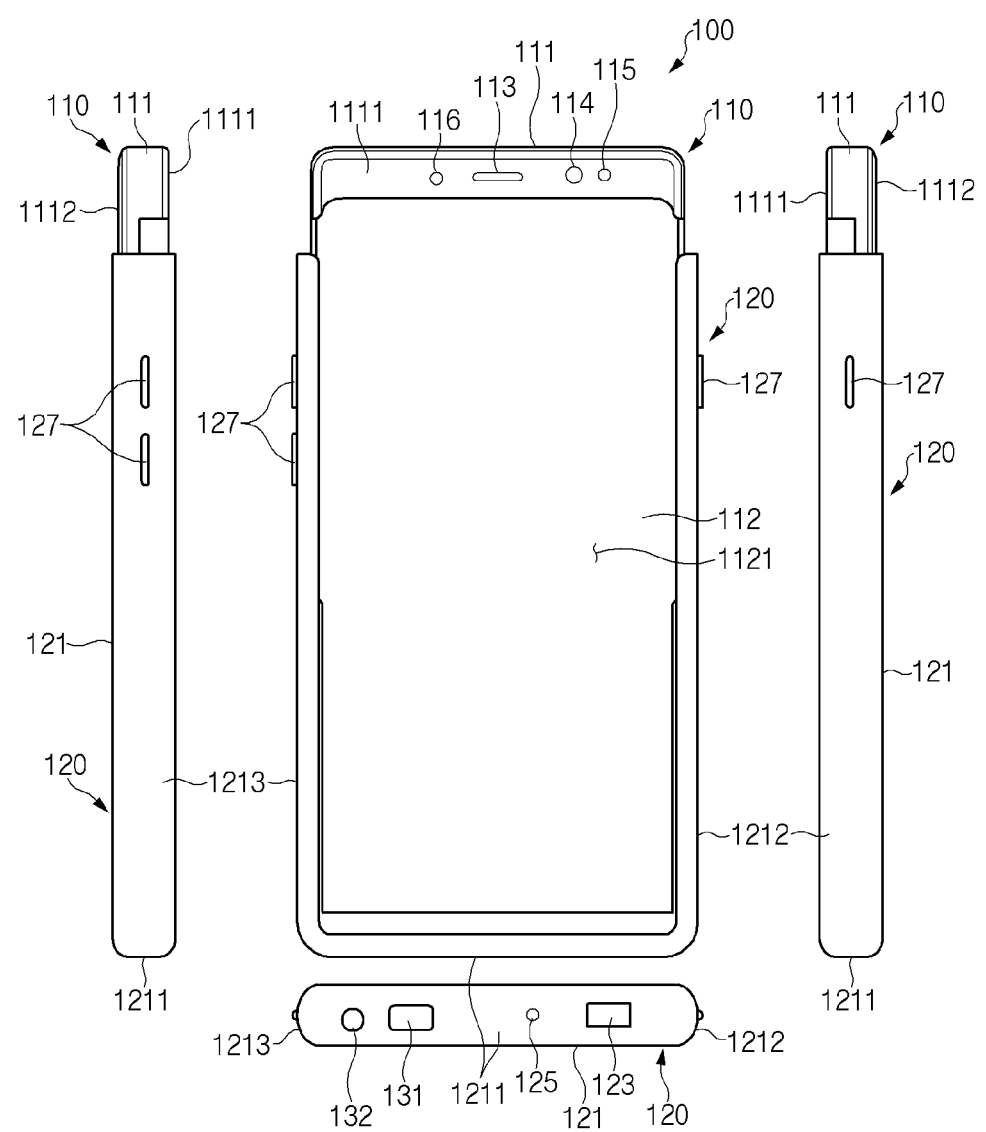

【Figure 1b】
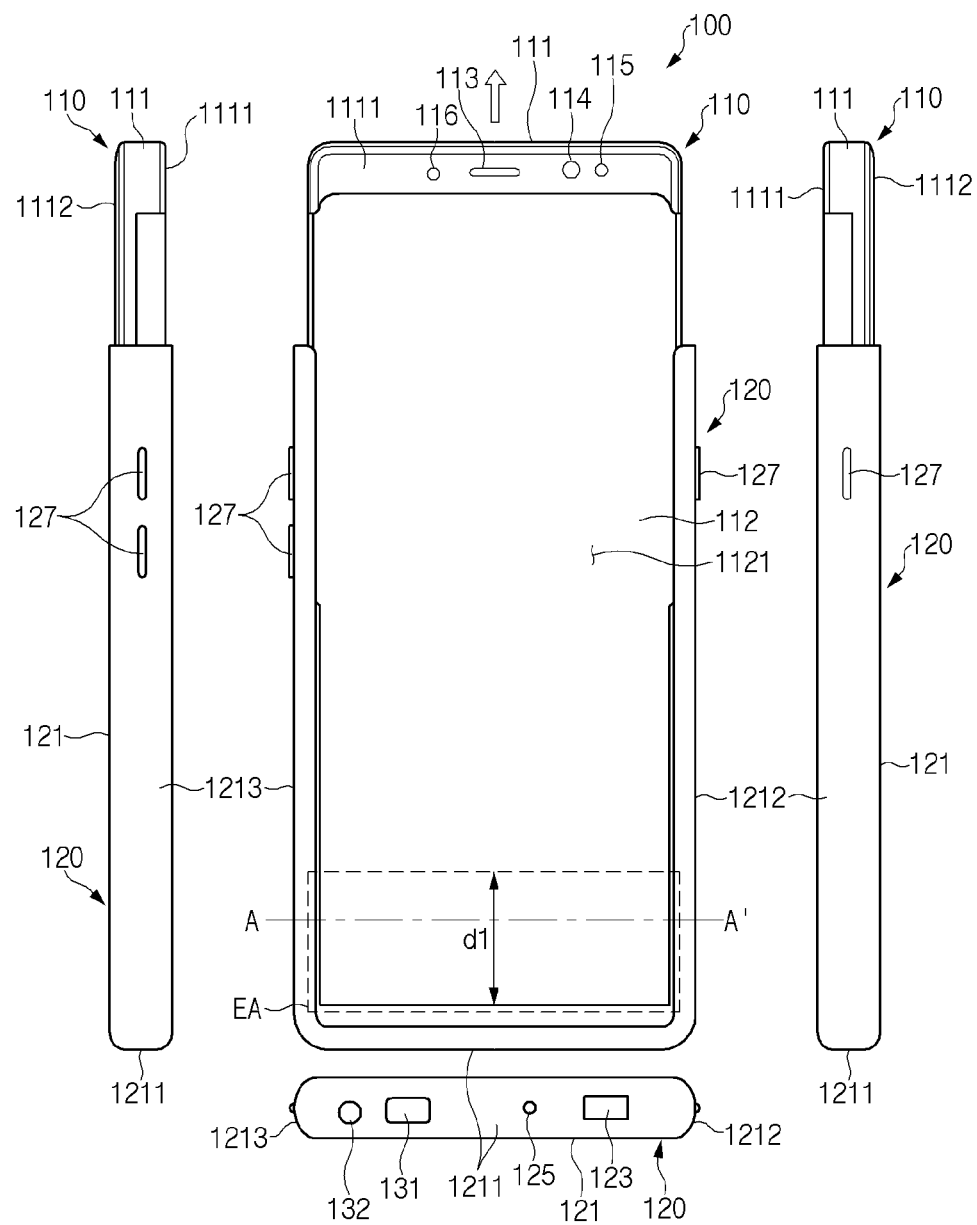

【Figure 1c】
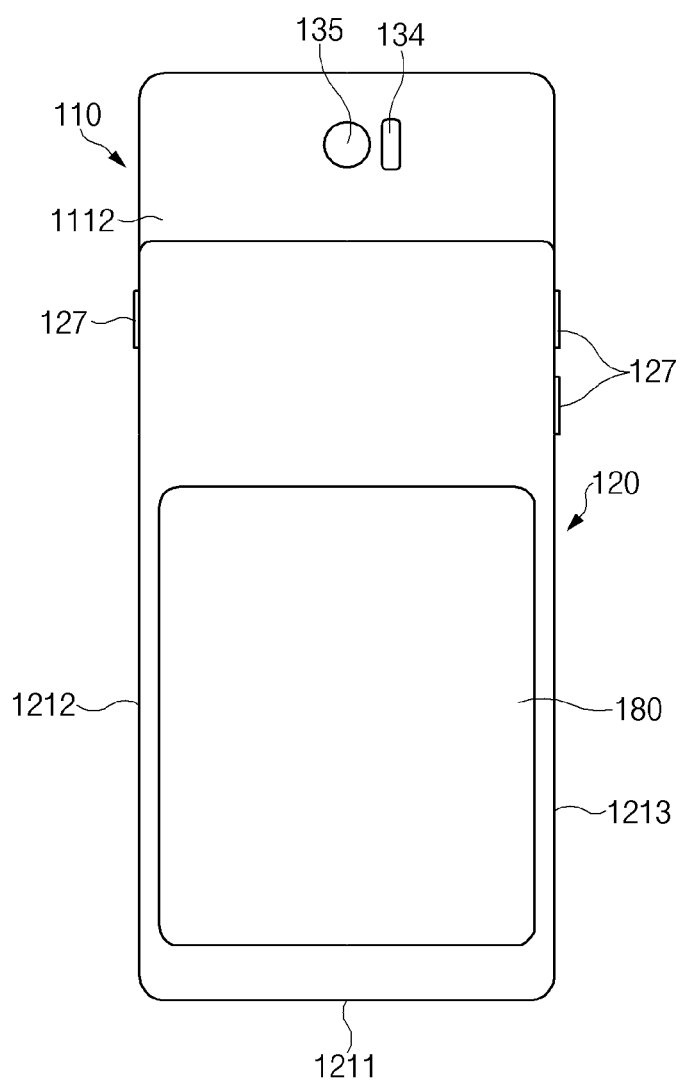

[Figure 2]
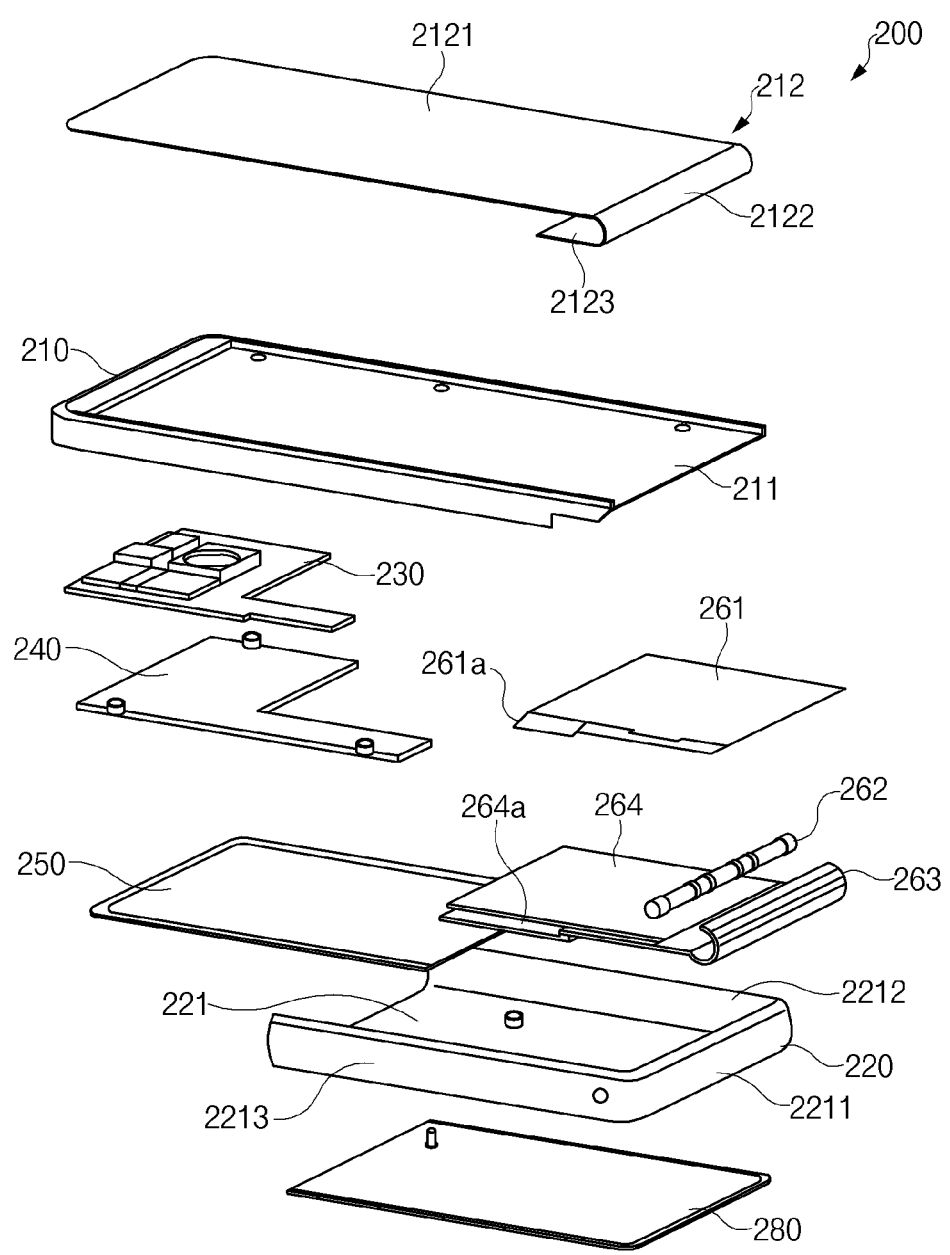

[Figure 3]
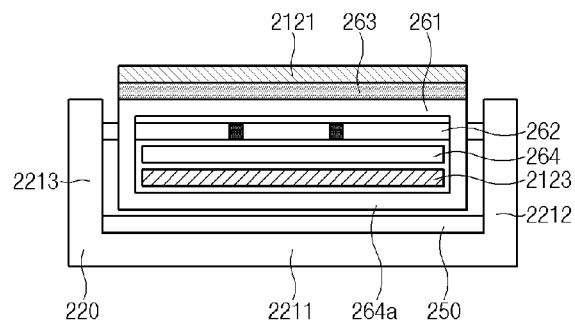
(a)
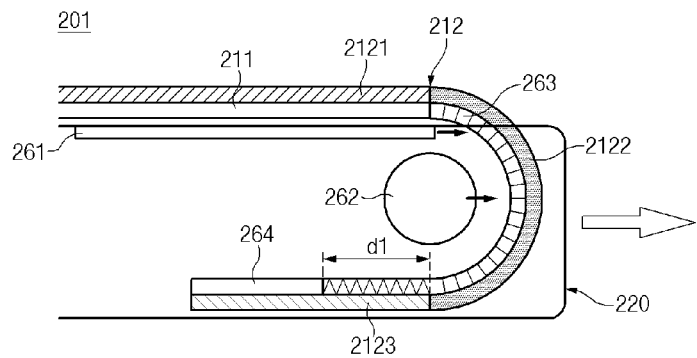
(b)
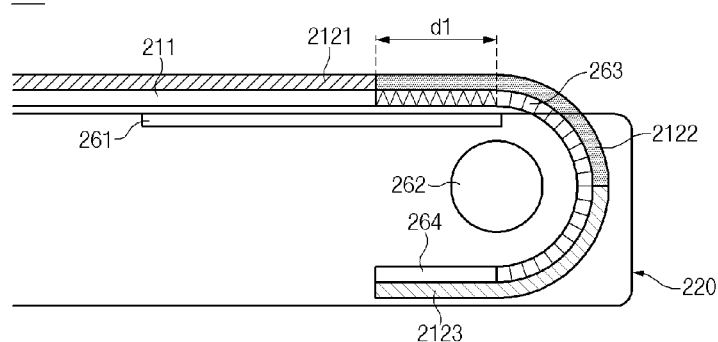
(c)

【Figure 4】
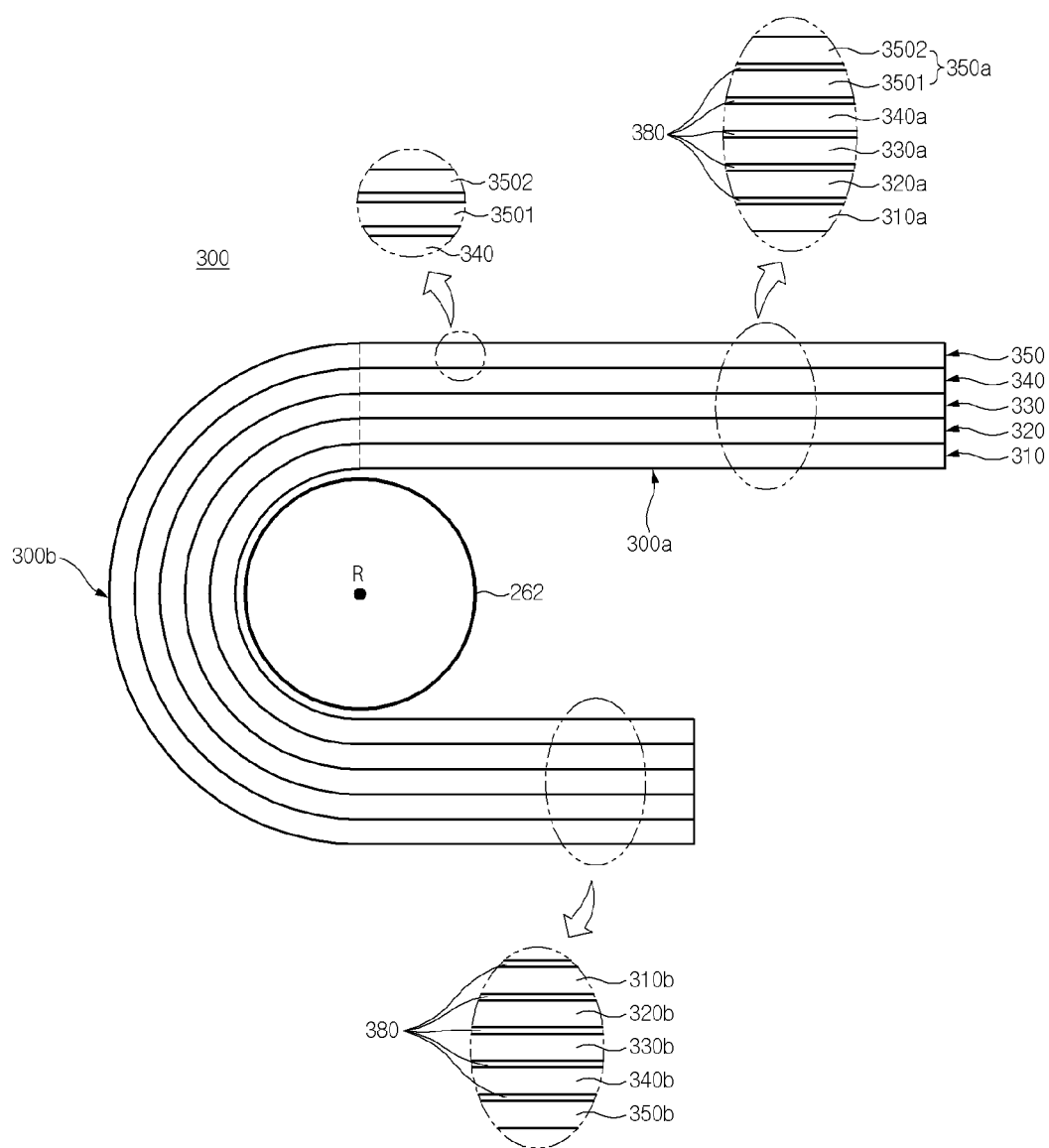

[Figure 6]
320a
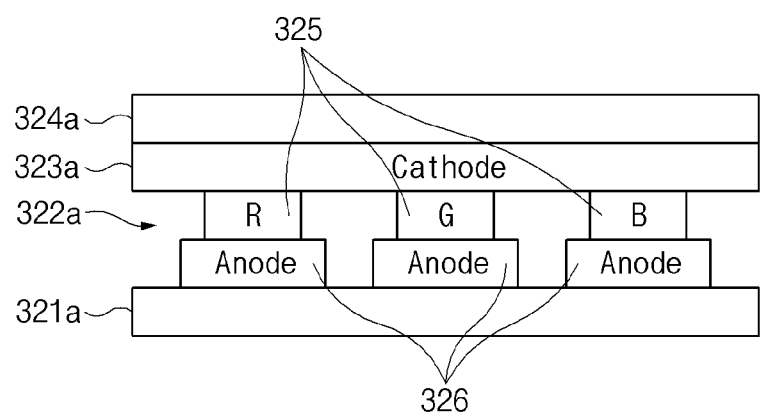
(a)
320b
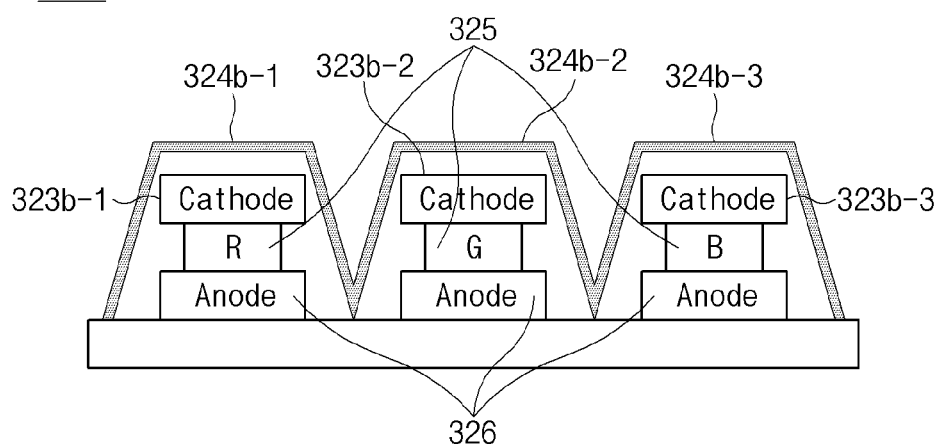
(b)

[Figure 7]
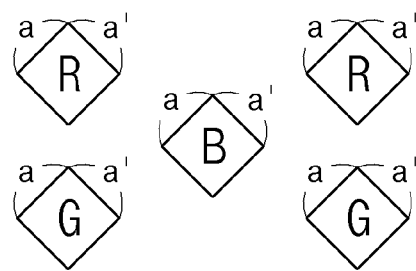
(a)
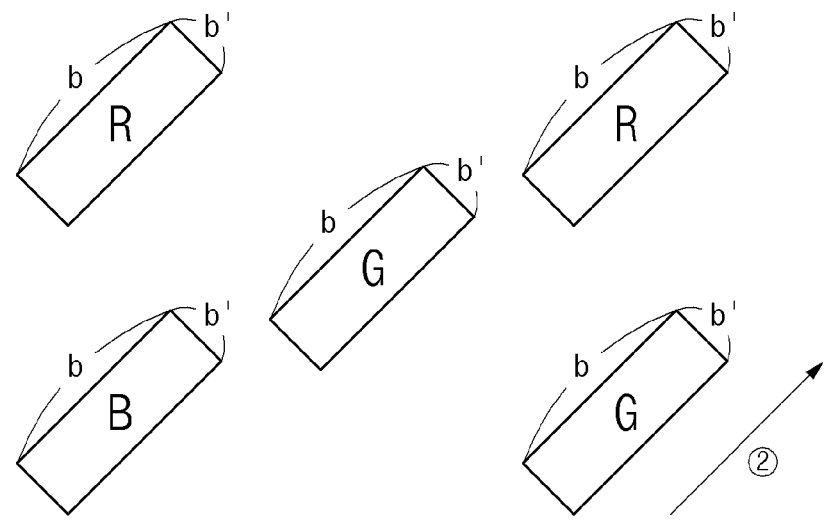
(b)

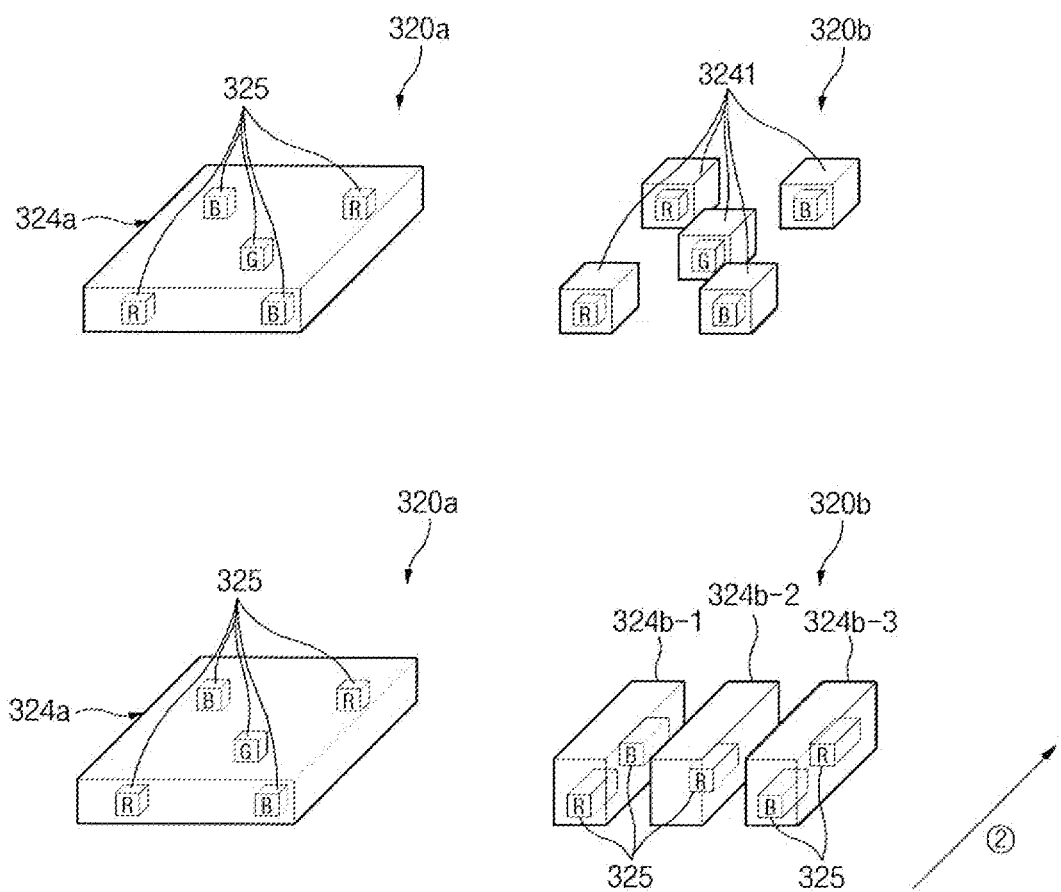
[Figure 8]

[Figure 9]
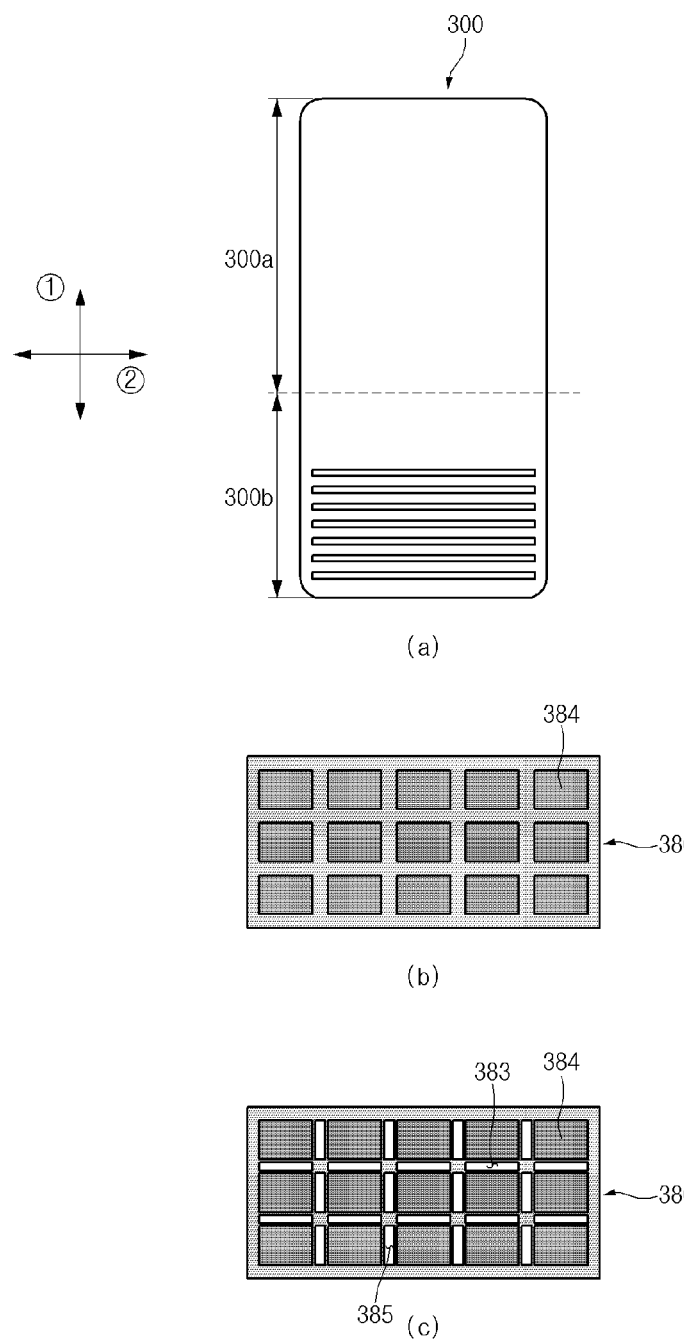

【Figure 10】
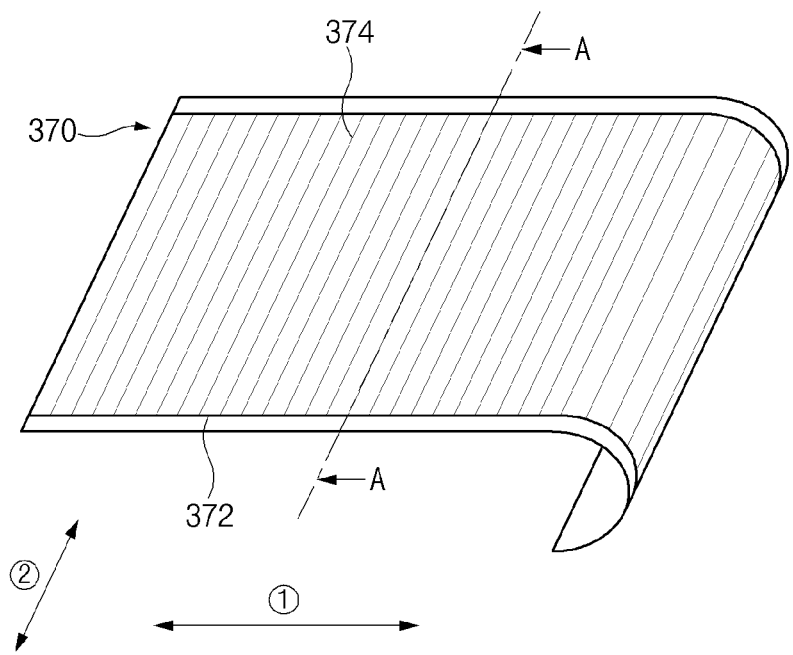
(a)
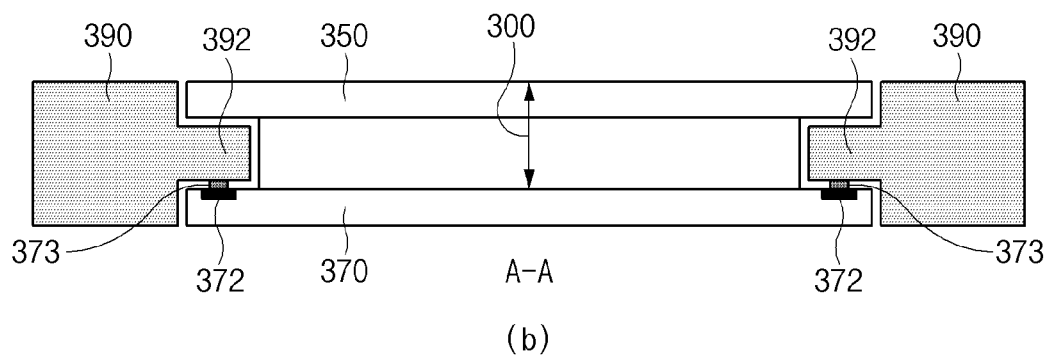
(b)

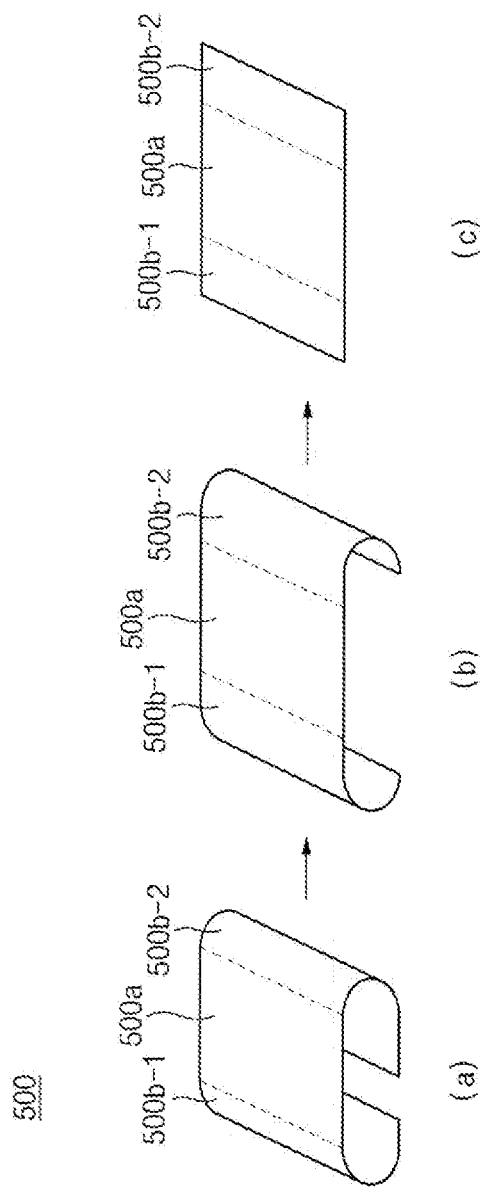
[Figure 11]

【Figure 12】
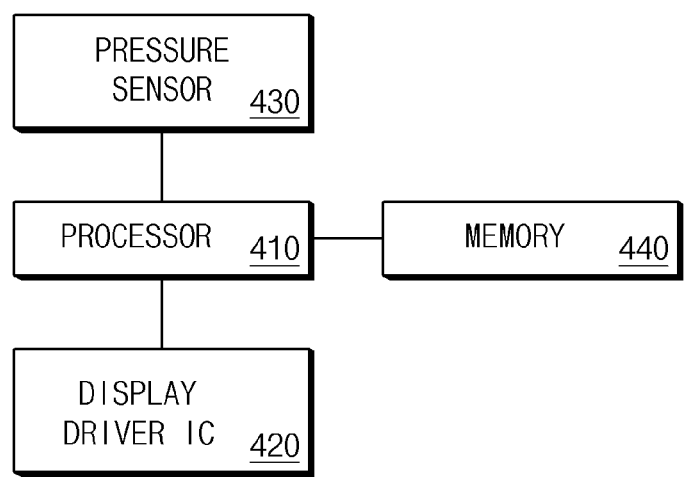

[Figure 13]
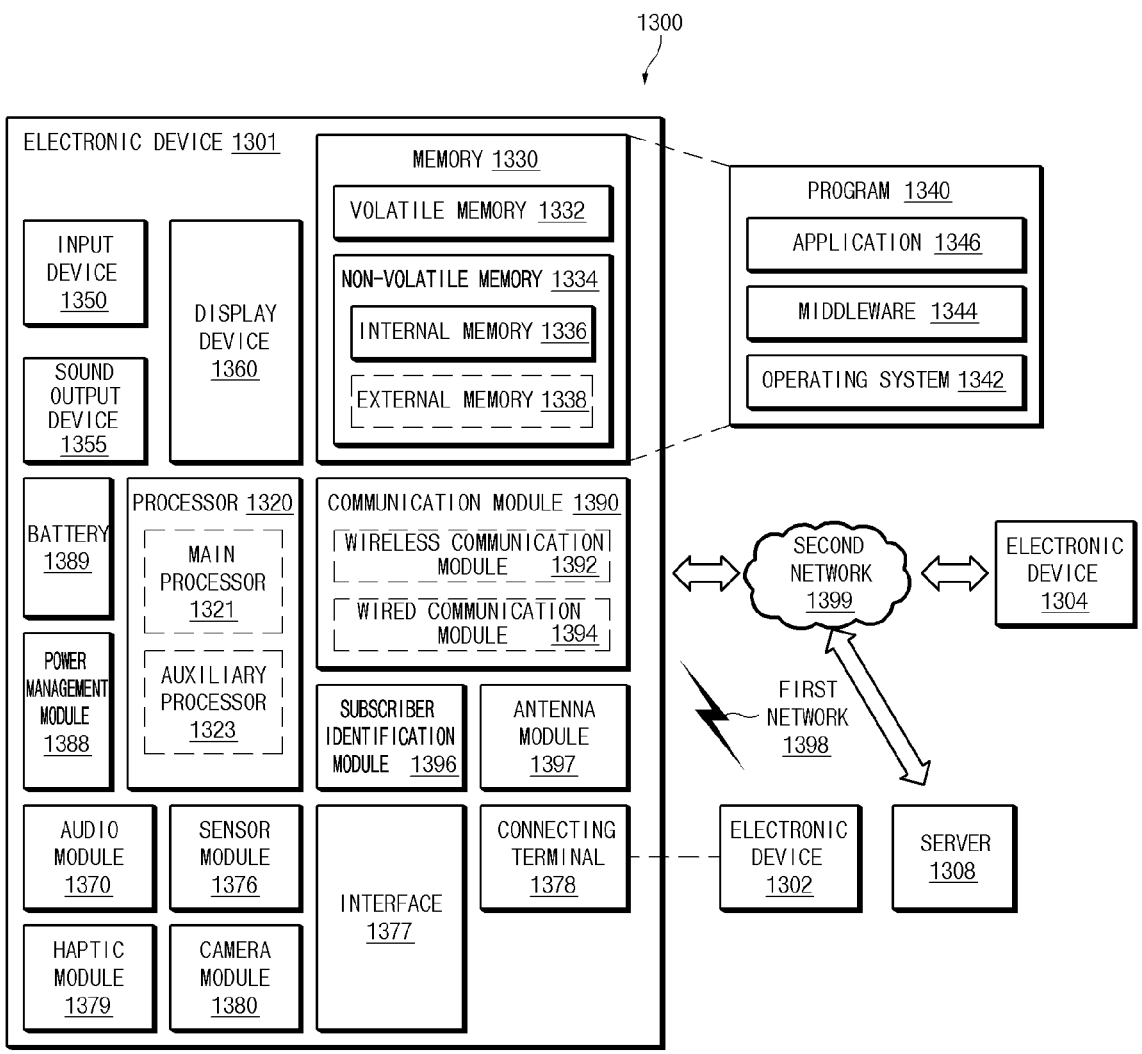

【Figure 14】
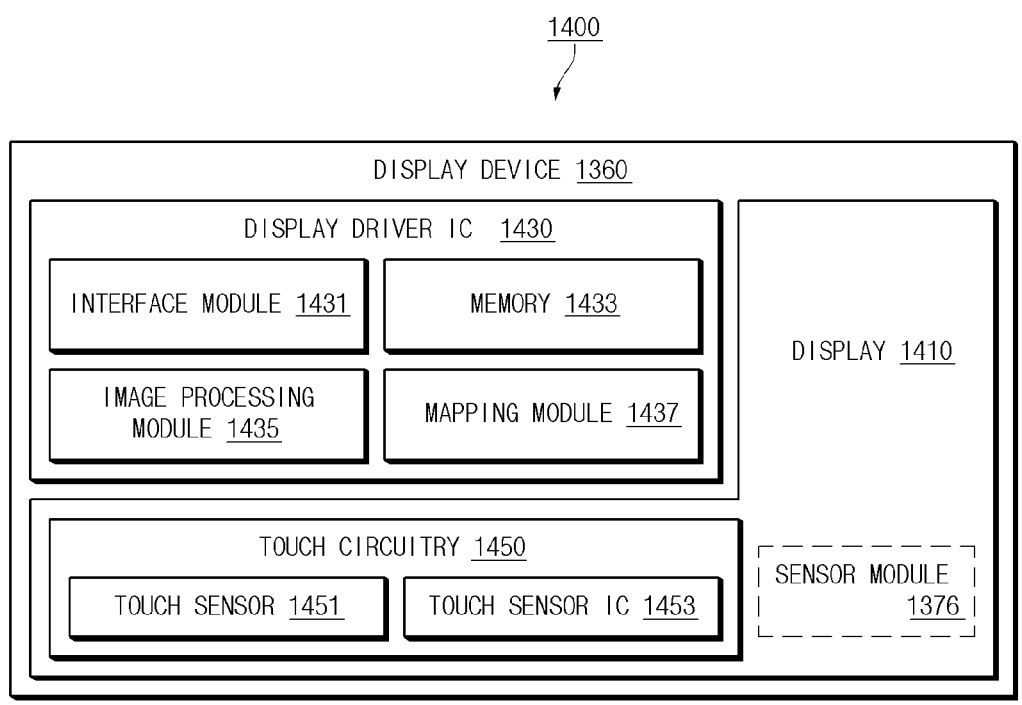

FLEXIBLE DISPLAY AND ELECTRONIC DEVICE HAVING SAME

CROSS REFERENCE TO RELATED APPLICATIONS

This application is a National Phase Entry of PCT International Application No. PCT/KR2019/002731, which was filed on Mar. 8, 2019, and claims a priority to Korean Patent Application No. 10-2018-0027647, which was filed on Mar. 8, 2018, the contents of which are incorporated herein by reference.

TECHNICAL FIELD

The disclosure relates to a flexible display and an electronic device including the same.

BACKGROUND ART

In recent years, with the remarkable decrease in a functional difference between portable electronic device manufacturers, developments for satisfying consumer preferences have been made. In particular, for aesthetics, portable electronic devices have been made slimmer and more compact in appearance. However, for an improvement in user convenience, displays having sufficient sizes are required. To expand display areas, flexible displays having flexibility may be employed for compact electronic devices.

DISCLOSURE

Technical Problem

A general display may have a partial region formed of a curved surface. The curved surface may be formed in a specific region of the display (e.g., at the periphery of the display).

An aspect of the disclosure is to provide a flexible display, at least part of which is able to be deformed into a flat surface and a curved surface.

Another aspect of the disclosure is to provide an electronic device including the flexible display, in which the electronic device is configured such that in a closed state, part of the flexible display is accommodated in the electronic device, and in an open state, the part of the flexible display forms a surface of the electronic device.

Technical Solution

According to an embodiment, an electronic device includes a flexible display including a plurality of layers and a support member having the flexible display mounted thereon. The flexible display includes a first region having a first flexibility and a second region having a second flexibility different from the first flexibility and extending from the first region in a first direction. At least one of the plurality of layers has a first structure in the first region and has a second structure different from the first structure in the second region. The support member includes a first portion that supports the first region such that at least part of the first region remains flat and a second portion that supports the second region such that at least part of the second region is bent and then unfolded.

According to various embodiments, an electronic device includes a first structure including a first plate, a second structure including a support plate disposed under the first plate, the second structure being slidably coupled with the first structure such that at least part of the support plate is movable to the outside of the first plate in a first direction, and a flexible display including a first region mounted on the first plate to form a surface of the electronic device and a second region extending from the first region in the first direction, at least part of the second region being disposed under the support plate. As the second structure slides relative to the first structure in the first direction, at least part of the second region is disposed above at least part of the support plate located outside the first plate and additionally forms the surface of the electronic device.

Advantageous Effects

According to the embodiments of the disclosure, the electronic devices may provide a large screen to a user in an open state and may provide portability to the user in a closed state.

In addition, the disclosure may provide various effects that are directly or indirectly recognized.

DESCRIPTION OF DRAWINGS

FIG. 1A is a plan view illustrating a front surface of an electronic device in a closed state according to an embodiment.

FIG. 1B is a plan view illustrating the front surface of the electronic device of FIG. 1A in an open state.

FIG. 1C is a plan view illustrating a rear surface of the electronic device of FIG. 1A.

FIG. 2 is an exploded perspective view of an electronic device according to various embodiments of the disclosure.

FIG. 3 is a view illustrating operation of the electronic device according to an embodiment.

FIG. 4 is a sectional view of a flexible display according to another embodiment.

FIG. 6 is a sectional view of a display panel of the flexible display according to various embodiments.

FIG. 7 is a plan view illustrating a pixel region formed by light emitting elements of the flexible display according to various embodiments.

FIG. 8 is a view illustrating a pixel array and a thin film encapsulation layer of the flexible display according to various embodiments.

FIG. 9 is a view illustrating pressure sensor arrays of the flexible display according to various embodiments.

FIG. 10 is a view illustrating the flexible display and an electronic device according to various embodiments.

FIG. 11 is a view illustrating a flexible display according to various embodiments.

FIG. 12 is a block diagram of an electronic device including a flexible display according to various embodiments.

FIG. 13 is a block diagram of an electronic device in a network environment according to various embodiments.

FIG. 14 is a block diagram of a display device according to various embodiments.

MODE FOR INVENTION

Figure 5:
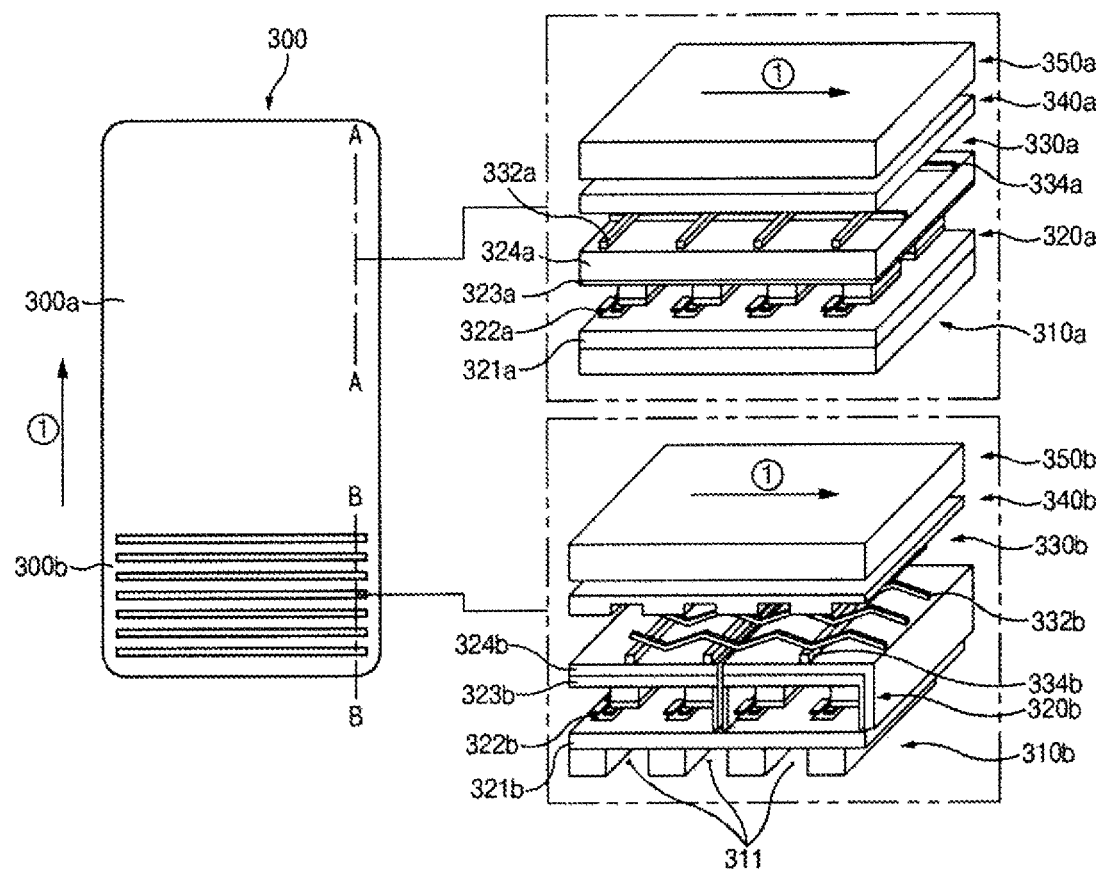
FIG. 5 is a perspective view of each layer of the flexible display according to the other embodiment.

FIGS. 1A and 1B are views illustrating an open state and a closed state of an electronic device according to various embodiments of the disclosure. FIG. 1C is a rear perspective view of the electronic device according to various embodiments of the disclosure.

FIG. 1A illustrates a state in which a first structure 110 is closed relative to a second structure 120, and FIG. 1B illustrates a state in which the first structure 110 is open relative to the second structure 120.

Referring to FIGS. 1A, 1B, and 1C, the electronic device 100 may include the first structure 110 and the second structure 120 disposed so as to be movable in the first structure 110. According to an embodiment, the first structure 110 may be disposed to perform reciprocating motion by a predetermined distance d1 in the illustrated directions relative to the second structure 120.

According to various embodiments, a first plate 111 of the first structure 110 may include a first surface 1111 and a second surface 1112 opposite to the first surface 1111. According to an embodiment, the second structure 120 may include a second plate 121, a first sidewall 1211 extending to the second plate 121, a second sidewall 1212 extending to the first sidewall 1211 and the second plate 121, and a third sidewall 1213 that extends to the first sidewall 1211 and the second plate 121 and that is parallel to the second sidewall 1212, or a second back plate 180 (e.g., a rear window). According to an embodiment, the second plate 121, the first sidewall 1211, the second sidewall 1212, and the third sidewall 1213 may be formed such that one side is open so as to accommodate at least part of the first structure 110. According to an embodiment, the second sidewall 1212 or the third sidewall 1213 may be omitted. According to an embodiment, the second plate 121, the first sidewall 1211, the second sidewall 1212, or the third sidewall 1213 may be formed in an integrated structure. In another example, the second plate 121, the first sidewall 1211, the second sidewall 1212, or the third sidewall 1213 may be formed of a separate structure and may be combined. According to an embodiment, the second back plate 180 may cover at least part of a display 112.

According to an embodiment, the first structure 110 is movable to the open state and the closed state relative to the second structure 120 in a first direction (e.g., direction □) parallel to the second plate 121 and the second sidewall 1212, and the first structure 110 may move so as to be located a first distance from the first sidewall 1211 in the closed state and a second distance greater than the first distance from the first sidewall 1211 in the open state.

According to an embodiment, the electronic device 100 may include at least one of the display 112, audio modules 113 and 123, camera modules 115 and 135, an indicator 116 (e.g., an LED device), sensor modules 114 and 134, key input devices 127, or connector holes 131 and 132.

According to an embodiment, the display 112 may include a planar portion 1121 that extends across at least part of the first surface 1111 and that is disposed on the first surface 1111 and a bendable portion that extends from the planar portion 1121 into a space between the first sidewall 1211 and the first structure 110 in the closed state. According to an embodiment, when viewed from above the first plate 111, at least part of the bendable portion of the display may be configured to move toward the planar portion by a predetermined display region E1 so as to form a substantially flat surface between the planar portion 1121 and the first sidewall 1211 in a case where the first structure 110 is moved from the closed state to the open state. The display 112 may be combined with, or disposed adjacent to, touch detection circuitry, a pressure sensor for measuring the intensity (pressure) of a touch, and/or a digitizer for detecting a stylus pen of a magnetic type.

According to an embodiment, the audio modules 113, 123, and 125 may include the speaker holes 113 and 123 or the microphone hole 125. The speaker holes 113 and 123 may include the receiver hole 113 or the external speaker hole 123. A microphone for obtaining a sound from the outside may be disposed in the microphone hole 125, and in some embodiments, a plurality of microphones may be disposed in the microphone hole 125 to detect the direction of a sound. In some embodiments, the speaker holes 113 and 123 and the microphone hole 125 may be implemented with one hole, or a speaker may be included without the speaker holes 113 and 123 (e.g., a piezo speaker). According to an embodiment, the receiver hole 113 may be disposed in the first structure 110, and the external speaker hole 123 or the microphone hole 125 may be disposed in the second structure 120. According to another embodiment, the external speaker hole 123 may be disposed on the second surface 1112 of the first plate 111 or a side surface of the first structure 110. According to another embodiment, the microphone hole 125 may be disposed on a side surface of the first structure 110.

According to an embodiment, the sensor modules 114 and 134 may generate an electrical signal or a data value that corresponds to an operational state inside the electronic device 100 or an environmental state external to the electronic device 100. The sensor modules 114 and 134 may include, for example, the first sensor module 114 (e.g., a proximity sensor) that is disposed on the first surface 1111 of the first plate 111, and/or the second sensor module (not illustrated) (e.g., a fingerprint sensor) and/or the third sensor module 134 (e.g., an HRM sensor) that is disposed on the second surface 1112 of the first plate 111. The electronic device 100 may further include a non-illustrated sensor module, which may be, for example, at least one of a gesture sensor, a gyro sensor, an atmospheric pressure sensor, a magnetic sensor, an acceleration sensor, a grip sensor, a color sensor, an infrared (IR) sensor, a biometric sensor, a temperature sensor, a humidity sensor, or the illuminance sensor.

According to an embodiment, the camera modules 115 and 135 may include the first camera device 115 disposed on the first surface 1111 of the first plate 111 and the second camera device 135 disposed on the second surface 1112. The first camera device 115 or the second camera device 135 may include one or more lenses, an image sensor, and/or an image signal processor. According to an embodiment, the second camera device 135 may be disposed on one surface of the second structure 120.

According to an embodiment, the key input devices 127 may be disposed on the second sidewall 1212 or the third sidewall 1213 of the second structure 120. The electronic device 100 may include a non-illustrated key input device, which may be, for example, a home key button or a touch pad disposed around the home key button. According to another embodiment, at least a part of the key input devices 127 may be located in one region of the first structure 110.

According to an embodiment, the indicator 116 may be disposed on the first surface 1111 of the first plate 111. For example, the indicator 116 may provide state information of the electronic device 100 in the form of light and may include an LED.

According to an embodiment, the connector holes 131 and 132 may include the first connector hole 131 for accommodating a connector (e.g., a USB connector) for transmitting and receiving power and/or data with an external electronic device, and/or the second connector hole (or, the earphone jack) 132 for accommodating a connector for transmitting and receiving audio signals with an external electronic device. According to an embodiment, the first connector hole 131 or the second connector hole 132 may be disposed on the first sidewall 1211 of the second structure 120. According to another embodiment, the first connector hole 131 or the second connector hole 132 may be formed on a sidewall of the first structure 110.

FIG. 2 is an exploded perspective view of an electronic device according to various embodiments of the disclosure.

Referring to FIG. 2, the electronic device 200 may include a display 212, a first structure 210, a first plate 211, a second structure 220, a second plate 221, a printed circuit board 230, a support member 240 (e.g., a rear case), a first back plate 250, a first hinge plate 261, a roller 262, a second hinge plate 264, or a second back plate 280 (e.g., a rear window). In some embodiments, the electronic device 200 may omit at least one component (e.g., the first support member 240 or the first back plate 250) among the aforementioned components, or may additionally include other component(s).

The display 212 may include a first surface 2121, a second surface 2122, and a third surface 2123, and a screen display region may be changed based on an exposed area according to various embodiments. The first surface 2121 and the third surface 2123 may form flat surfaces, and the second surface 2122 may form a curved surface.

The first structure 210 may include the first plate 211. The first structure 210 may be formed of, for example, a metallic material and/or a nonmetallic (e.g., polymer) material. The display 212 may be coupled to one surface of the first plate 211, and the printed circuit board 230 may be coupled to an opposite surface of the first plate 211. The first plate 211 may be connected with one side of a multi-bar 263 that is at least connected with the second surface 2122 of the display 212. The first structure 210 may fix the second hinge plate 264.

The first hinge plate 261 may support the multi-bar 263 when the display 212 is expanded. The first hinge plate 261 and a first hinge plate fixing portion 261a may be integrally formed with each other. The first hinge plate fixing portion 261a may be connected to a second hinge plate fixing portion 264a included in the second hinge plate 264.

The roller 262 may guide or support the multi-bar 263 to move the multi-bar 263 at a predetermined radius. The roller 262 may be connected to the second hinge plate fixing portion 264a or the first hinge plate 261.

The multi-bar 263 may be formed of a plurality of straight rods. The multi-bar 263 may support at least part of the second surface 2122 of the display 212. One side of the multi-bar 263 may be connected to the second hinge plate 264, and an opposite side of the multi-bar 263 may be connected to the first structure 210.

The second hinge plate 264 may support the third surface 2123 of the display 212. When the display 212 is expanded, the second hinge plate 264 may be moved in conjunction with the multi-bar 263 such that a screen is expanded. The second hinge plate 264 may be formed of a part separate from the second hinge plate fixing portion 264a. The second hinge plate 264 may be fixed to the first structure 210 such that the second hinge plate 264 slides.

The second structure 220 may be formed to surround at least part of the first structure 210, the second hinge plate 264, and the multi-bar 263. According to an embodiment, the second structure 220 may include the second plate 221, a first sidewall 2211 extending to the second plate 221, a second sidewall 2212 extending to the first sidewall 2211 and the second plate 221, and a third sidewall 2213 that extends to the first sidewall 2211 and the second plate 221 and that is parallel to the second sidewall 2212. The second structure 220 may form a space for accommodating a component, such as an antenna, in a space not overlapping the multi-bar 263. The second structure 220 may include the second back plate 280 that covers at least part of the third surface 2123 of the display 212.

The second back plate 280 may contain a non-light-transmitting material in a case where it is not necessary to display information on the third surface 2123 of the display 212. In another example, the second back plate 280 may be formed of a light-transmitting material so as to display information on the third surface 2123 of the display 212. The second back plate 280 may be integrally formed with the second structure 220.

The support member 240 may be disposed between the printed circuit board 230 and the first back plate 250.

A processor, a memory, and/or an interface may be mounted on the printed circuit board 230. The processor may include, for example, one or more of a central processing unit, an application processor, a graphic processing unit, an image signal processor, a sensor hub processor, or a communication processor. In a case where the display 212 is expanded or reduced, the first structure 210 may move while being guided through the first hinge plate 261.

The memory may include, for example, a volatile memory or a nonvolatile memory.

The interface may include, for example, a high definition multimedia interface (HDMI), a universal serial bus (USB) interface, an SD card interface, and/or an audio interface. For example, the interface may electrically or physically connect the electronic device 200 with an external electronic device and may include a USB connector, an SD card/MMC connector, or an audio connector.

FIG. 3 is a view illustrating operation of the electronic device according to an embodiment.

FIG. 3(a) is a sectional view taken along line A-A' of FIG. 1B. FIG. 3(b) is a view illustrating a closed state of the electronic device according to an embodiment. FIG. 3(c) is a view illustrating an open state of the electronic device according to an embodiment.

Referring to FIG. 3(a), the second plate 221, the second hinge plate fixing portion 264a, the flexible display 212, the second hinge plate 264, the roller 262, the first hinge plate 261, and the multi-bar 263 may be disposed in the second structure 220.

As described above, between the closed state (FIG. 3(b)) and the open state (FIG. 3(a)) of the electronic device 200, the second structure 220 may slide relative to the first structure 210. The first hinge plate 261, the second hinge plate fixing portion 264a, and the roller 262 may be connected to the second structure 220. That is, as illustrated in FIG. 3(b), the first hinge plate 261, the second hinge plate fixing portion 264a, and the roller 262 may move together with the second structure.

In contrast, one side of the first surface 2121 of the flexible display 212 may be connected with the first plate 211 formed in the first structure 210, and an opposite side of the first surface 2121 of the flexible display 212 may be connected with the multi-bar 263. Furthermore, the second hinge plate 264 may be connected with the multi-bar 263. In addition, the third surface 2123 of the flexible display 212 may move together while being seated or supported on the multi-bar 263. Accordingly, the flexible display 212, the multi-bar 263, and the second hinge plate 264 may be connected to the first structure 210. The flexible display 212, the multi-bar 263, and the second hinge plate 264 may not move together with the second structure 220.

As illustrated in FIG. 3(b), the electronic device 200 may include the flexible display 212, the first plate 211 formed in the first structure 210, the multi-bar 263 connected to the first plate 211, and the second hinge plate 264 connected with the multi-bar 263. The first plate 211, the multi-bar 263, and the second hinge plate 264 may support the flexible display 212.

The flexible display 212 may include the first surface 2121 that is formed of a flat surface and that forms a front surface of the electronic device 200, the second surface 2122 that extends from the first surface 2121 and that is formed of a flat surface or a curved surface, and the third surface 2123 that extends from the second surface 2122 and that is formed of a flat surface.

In the closed state (FIG. 3(b)), the first surface 2121 may be formed of a flat surface, the second surface 2122 may be formed of a curved surface, and the third surface 2123 may be formed of a flat surface. The first surface 2121 may form the front surface of the electronic device 200, and the third surface 2123 may be disposed in the electronic device 200 (e.g., the second structure 220).

Between the closed state (FIG. 3(b)) and the open state (FIG. 3(a)), the second surface 2122 may be at least partially formed of a flat surface and may form part of the front surface of the electronic device 200. The third surface 2123 may be at least partially formed of a curved surface and may be accommodated in the second structure 220 of the electronic device 200.

As described above, the electronic device 200 may move from the closed state (FIG. 3(b)) to the open state (FIG. 3(a)) in a case where the second structure 220 slides relative to the first structure 210 in the direction of an arrow.

In the sliding operation, the second structure 220 may move together with the roller 262 and the first hinge plate 261. The roller 262 and the first hinge plate 261 may be coupled to the second structure 220 so as to be movable together. In a state between the closed state and the open state and in the open state (FIG. 3(a)), the first hinge plate 261 may support at least part of the flexible display 212.

In contrast, the first plate 211, the multi-bar 263, and the second hinge plate 264 may be coupled to the first structure 210 and may be fixed in position irrespective of the sliding operation of the second structure 220.

In the illustrated embodiment, the flexible display 212 may be deformed depending on states. For example, in the open state and the closed state, the first surface 2121 of the flexible display 212 may be formed of a flat surface. In this case, the first surface 2121 may be disposed on the first plate 211. For example, in the open state (FIG. 3(a)), the second surface 2122 may be formed of a flat surface, and in the closed state (FIG. 3(b)), part of the second surface 2122 may be formed of a flat surface, and the remaining part may be formed of a curved surface. In this case, the flat surface region of the second surface 2122 may be disposed on the first plate 211. For example, in the open state (FIG. 3(a)), the third surface 2123 may be formed of a flat surface, and in the closed state (FIG. 3(b)), part of the third surface 2123 may be formed of a curved surface, and the remaining part may be formed of a flat surface.

FIG. 4 is a sectional view of a flexible display according to another embodiment.

Referring to FIG. 4, the flexible display 300 (e.g., the flexible display 212 of FIG. 2) may include a first region 300a, a second region 300b, and a plurality of layers extending across the first region 300a and the second region 300b.

In the flexible display 300 according to the other embodiment, a surface on which a cover layer 350 is formed is referred to as a front surface, and an opposite surface is referred to as a rear surface.

The first region 300a and the second region 300b may extend in the plurality of layers described above. That is, regions corresponding to the first region 300a and the second region 300b, respectively, may be formed in each layer. The flexibilities of the first region 300a and the second region 300b may differ from each other.

In an embodiment, the first region 300a may be generally formed of a flat surface, and the cover plate 350 may be disposed on one surface of the first region 300a. The first region 300a may be formed to have a lower flexibility than the second region 300b. Furthermore, unlike the second region 300b, the first region 300a may be formed of a flat surface.

In an embodiment, part of the second region 300b may be formed of a curved surface. To this end, the second region 300b may be formed to have a higher flexibility than the first region 300a. The portion (e.g., the second surface 2122 of FIG. 2) of the second region 300b that is formed of a curved surface may have a predetermined curvature by the roller 262. In this case, the roller 262 may be disposed in a direction perpendicular to the direction in which the second region 300b extends from the first region 300a. That is, the second region 300b may extend along the circumferential direction of the roller 262.

In various embodiments, the second region 300b may be deformed depending on a state change of an electronic device (e.g., the electronic device 100 of FIG. 1A or the electronic device 200 of FIG. 2) that includes the flexible display 300. For example, the second region 300b may be formed of a flat surface or a curved surface depending on a state (e.g., an open state or a closed state) of the electronic device.

In various embodiments, some of the layers included in the second region 300b may have a different structure from the layers included in the first region 300a. In various embodiments, in at least one of the layers, the first region 300a and the second region 300b may be formed in different shapes, or may have different structures.

Hereinafter, the layers of the flexible display 300 according to an embodiment will be described.

In the illustrated embodiment, the flexible display 300 may have the plurality of layers stacked one above another. The plurality of layers may be included in the first region 300a and the second region 300b. Hereinafter, the layers included in the first region 300a may be denoted by adding "a" to the reference numerals of the layers, and the layers included in the second region 300b may be denoted by adding "b" to the reference numerals of the layers.

In the illustrated embodiment, the plurality of layers may include a base film 310, a display panel 320, a touch sensor layer 330 disposed on the display panel 320, a polarization layer 340, and the cover layer 350.

In various embodiments, the base film 310 may be disposed on a rear surface of the display panel 320 and may protect the display panel 320. The base film 310 may be formed of a flexible material. The base film 310 may include an EMBO layer and/or a cushion layer. However, the EMBO layer or the cushion layer may be omitted depending on the flexibility of the flexible display 300.

In various embodiments, the display panel 320 may include, for example, a liquid crystal display (LCD) panel, a light emitting diode (LED) display panel, an organic light emitting diode (OLED) display panel, a microelectromechanical systems (MEMS) display panel, or an electronic paper display panel.

In various embodiments, the touch sensor layer 330 may be formed such that a plurality of touch electrodes are arranged. The touch electrodes may be controlled by a touch sensor IC and may measure a change in a signal (e.g., voltage, an amount of light, resistance, or an amount of electric charge) for a specific location of the flexible display 300 to detect a touch input or a hovering input to the specific location and may provide information (e.g., location, area, pressure, or time) regarding the detected touch or hovering input to a processor (e.g., a processor 410 of FIG. 12.) of the electronic device (e.g., an electronic device 400 of FIG. 12). According to an embodiment, at least a part (e.g., the touch sensor IC) of the touch sensor layer 330 may be included as a display driver IC, part of the display, or part of another component (e.g., an auxiliary processor) external to the display.

In various embodiments, the touch sensor layer 330 may be formed of a thin film. Touch electrodes having a thin film form may be formed on the thin film. As will be described below, the touch sensor layer 330 may be disposed on a thin film encapsulation layer (e.g., a thin film encapsulation layer 324 of FIG. 5). For example, the touch sensor layer 330 may be integrally formed with the thin film encapsulation layer 324.

In various embodiments, the polarization layer 340 may be disposed on the touch sensor layer 330. The polarization layer 340 may be attached to the touch sensor layer 330 through an optical clear adhesive (OCA). The polarization layer 340 may prevent reflection of external light to ensure black visibility of the flexible display 300. For example, the polarization layer 340 may prevent reflection of light incident through the cover layer 350 disposed on the polarization layer 340, thereby improving visibility of a user.

In various embodiments, the polarization layer 340 may include, for example, a poly ethylene terephthalate (PET) film, a tri-acetyl cellulose (TAC) film, a cycle-olefin polymer (COP) film, or a poly-vinyl alcohol (PVA) film. To ensure the flexibility of the flexible display 300 according to the other embodiment, the polarization layer 340, unlike a polarization layer of an existing display, may be formed of a thin film. The polarization layer 340 may be disposed between the touch sensor layer 330 and the cover layer 350, or may be disposed between the touch sensor layer 330 and the thin film encapsulation layer 324.

In various embodiments, the cover layer 350 may be disposed on the front surface of the flexible display 300 and may protect the flexible display 300 from external shock. The cover layer 350 may contain a material having physical flexibility. The cover layer 350 may contain a transparent material so as to have a high light transmittance.

In various embodiments, a cover layer 350a included in the first region and a cover layer 350b included in the second region may be formed of different materials. For example, the cover layer 350a included in the first region may be formed of a rigid material, and the cover layer 350b included in the second region may be formed of a relatively flexible material.

Referring to FIG. 4, the cover layer 350a included in the first region 300a may include a first cover layer 3501 and a second cover layer 3502. This may be because the cover layer 350a included in the first region 300a further requires mechanical rigidity, compared to the cover layer 350b included in the second region 300b. For example, mechanical reliability such as impact resistance may be required because the cover layer 350a included in the first region 300a is exposed on a surface of the electronic device. Accordingly, the cover layer 350a included in the first region 300a may further include the plurality of sub-layers 3501 and 3502. For example, the cover layer 350a included in the first region 300a may include a double cover layer.

In the illustrated embodiment, for the flexibility of the second region 300b of the flexible display 300, the cover layer 350b included in the second region 300b may be formed to be thinner than the cover layer 350a included in the first region 300a, or may include a smaller number of layers than the cover layer 350a.

In various embodiments, the flexible display 300 may further include a pressure sensitive adhesive layer 380. The pressure sensitive adhesive layer 380 may prevent a defect that is likely to occur in the flexible display 300, at least part of which is formed of a curved surface. For example, tensile stress and compressive stress may act on each layer of a curved region (e.g., the second region 300b) of the flexible display 300. Some of the plurality of layers may be stripped or buckled by the stresses.

In various embodiments, the pressure sensitive adhesive layer 380 may have a lower modulus and a higher elasticity than the other layers. The pressure sensitive adhesive layer 380 may be disposed between the layers. In various embodiments, the pressure sensitive adhesive layer 380 may contain a pressure sensitive adhesive material. Accordingly, stress load acting on each layer may be decreased.

FIG. 5 is a perspective view of each layer of the flexible display according to the other embodiment.

In the illustrated embodiment, the flexible display 300 may include the base film 310, the display panel 320, the touch sensor layer 330, the polarization layer 340, and the cover layer 350.

In the illustrated embodiment, the display panel 320 may include a substrate 321, a pixel array 322 formed on the substrate 321, an electrode layer 323 covering the pixel array, and the thin film encapsulation layer 324 covering the pixel array 322 and the electrode layer 323.

In various embodiments, the pixel array 322 may include a plurality of pixels. Each pixel may be formed by a light emitting element. For example, the light emitting element may include an OLED. The light emitting element may be electrically connected with a display driver IC (e.g., a display driver IC 420 of FIG. 12) and may emit light depending on an electrical signal. The display driver IC may include a driver IC (e.g., a DDI). The driver IC may transmit power and/or an image signal to the plurality of light emitting elements through wires.

In various embodiments, the electrode layer 323 electrically connected with the plurality of light emitting elements and the thin film encapsulation layer 324 for encapsulating the pixel array 322 may be formed over the pixel array 322. Because the OLED elements are very vulnerable to water and oxygen, the thin film encapsulation layer 324 may prevent infiltration of water and oxygen into the light emitting elements 122.

In various embodiments, the thin film encapsulation layer 324 may be formed of a thin film encapsulation (TFE) film. The TFE film may include, for example, a plurality of organic layers and/or inorganic layers and may thus protect the plurality of light emitting elements from moisture or oxygen. The touch sensor layer 330 may be formed on the thin film encapsulation layer 324.

In various embodiments, the thin film encapsulation layer 324 may additionally cover the electrode layer 323. The electrode layer 323 may be electrically connected with the pixels. The electrode layer 323 may be formed in the shape of a layer disposed over the pixel array 322. For example, to form a moisture barrier, the electrode layer 323 may contain an inorganic material, such as aluminum oxide, and an organic material, such as a polymer (e.g., epoxy), which acts as a shock absorbing layer when required.

In various embodiments, the thin film encapsulation layer 324 may have a structure in which a composite layer including an organic layer and an inorganic layer is alternately stacked. For example, the thin film encapsulation layer 324 may include a thin film evaporation (TFE) film. The thin film encapsulation layer 324 may be referred to as an encapsulation layer.

In various embodiments, the touch sensor layer 330 may include a plurality of touch electrodes arranged on a substrate, touch sensor circuitry electrically connected to control the touch electrodes, and wires 332 and 334 electrically connecting the touch electrodes and the touch sensor circuitry.

In the illustrated embodiment, in at least some of the plurality of layers, a portion included in the first region 300a may have a different structure, shape, or form from a portion included in the second regions 300b. Here, a direction in which the first region 300a extends from the second region 300b is referred to as a first direction (direction □ in the drawing).

In various embodiments, a base film 310b included in the second region 300b may have a different structure from a base film 310a included in the first region 300a. For example, the base film 310b included in the second region 300b may have a groove 311 formed thereon in a direction perpendicular to an extension direction.

In various embodiments, a plurality of grooves 311 formed on the base film 310 may be formed in a direction perpendicular to the first direction of the flexible display 300. Accordingly, in a case where the second region 300b is curved or bent, damage to the base film 310 may be prevented.

In various embodiments, a touch sensor layer 330b included in the second region 300b may have a different structure from a touch sensor layer 330a included in the first region 300a. For example, the touch sensor layer 330 may include a first wire 332a or 332b extending in a column direction (e.g., the first direction) of the touch sensor layer 330 and a second wire 334a or 334b intersecting with the first wire. The wires 332a, 332b, 334a, and 334b may be formed of conductive patterns printed on the substrates. One of the first wire 332a or 332b and the second wire 334a or 334b may be connected with a receiving electrode, and the other may be connected with a transmitting electrode.

In the illustrated embodiment, in the first region 300a of the flexible display 300, the first wire 332a may be formed to be perpendicular to the second wire 334a. For example, the first wire 332a may extend in a direction perpendicular to an extension direction (e.g., the first direction) of the flexible display 300. The second wire 334a may extend in a direction parallel to the extension direction (e.g., the first direction) of the flexible display 300.

In the illustrated embodiment, in the second region 300b of the flexible display 300, the first wire 332b may include a zigzag pattern. The second wire 334b may extend in the direction perpendicular to the extension direction (e.g., the first direction) of the flexible display 300.

In various embodiments, the second wires 334a and 334b may extend in a direction parallel to a bending axis (e.g., R of FIG. 4) of the second region 300b (e.g., a direction perpendicular to the first direction). In a case where the second region 300b is bent, the first wire 332b included in the second region 300b may not be damaged.

In various embodiments, the first wire 332a included in the first region 300a may extend in a direction (e.g., the first direction) perpendicular to the bending axis (e.g., R of FIG. 4) of the second region 300b. However, the second wire 334a included in the first region 300a may not be damaged because the first region 300a is formed of a flat surface in each of states (e.g., a closed state and an open state) of the electronic device.

In various embodiments, the first wire 332b included in the second region 300b may extend in a direction (e.g., the first direction) substantially perpendicular to the bending axis (e.g., R of FIG. 4) of the second region 300b. In a case where the second region 300b is bent, stress may act on the first wire 332b included in the second region 300b. The first wire 332b included in the second region 300b may be damaged or short-circuited by the stress. The flexible display 300 may be configured such that the second region 300b includes the first wire 332b formed in a zigzag pattern. Accordingly, the stress acting on the first wire 332b may be distributed. For example, the zigzag pattern may provide a predetermined elastic force to the first wire 332b to distribute the stress.

In the illustrated embodiment, the display panel 320 may include the thin film encapsulation layer 324 formed to cover the pixel array 322 including the plurality of light emitting elements and the cathode electrode layer 323 formed between the light emitting elements and the thin film encapsulation layer 324.

In various embodiments, in the first region 300a, the thin film encapsulation layer 324 may be formed to entirely cover the pixel array 322. For example, the thin film encapsulation layer 324 may be integrally formed.

In various embodiments, in the second region 300b, the thin film encapsulation layer 324 may include a plurality of sub-thin film encapsulation layers formed in the direction perpendicular to the extension direction (the first direction) of the flexible display 300. The sub-thin film encapsulation layers may be disposed adjacent to each other in the extension direction of the flexible display 300 in a case where the second region 300b is in a planar state.

For example, in a case where the second region 300b is bent from a flat surface to a curved surface, stress may act on the thin film encapsulation layer 324. The stress may damage the thin film encapsulation layer 324, and therefore oxygen or moisture may infiltrate into the pixel array 322 encapsulated by the thin film encapsulation layer 324. The flexible display 300 according to the embodiment of the disclosure may include the sub-thin film encapsulation layers extending in the direction parallel to the bending axis (e.g., R of FIG. 4) of the second region 300b, and thus damage to the thin film encapsulation layer 324 may be prevented even in a case where the second region 300b is formed of a curved surface.

FIG. 6 is a sectional view of the display panel of the flexible display according to various embodiments. FIG. 6(a) is a sectional view of the first region. FIG. 6(b) is a sectional view of the second region.

Referring to FIG. 6(a), in the first region 300a, a thin film encapsulation layer 324a may be formed in a layer form to cover a pixel array 322a. The pixel array 322a may include light emitting elements. The thin film encapsulation layer 324a may be integrally formed to cover the entire pixel array 322a.

Referring to FIG. 6(b), a thin film encapsulation layer 324b included in the second region 300b may include a plurality of sub-thin film encapsulation layers 324b-1, 324b-2, and 324b-3. The sub-thin film encapsulation layers 324b-1, 324b-2, and 324b-3 may extend in the direction parallel to the bending axis (e.g., R of FIG. 4) of the second region 300b.

In the illustrated embodiment, the sub-thin film encapsulation layers 324b-1, 324b-2, and 324b-3 may be spaced apart from each other at predetermined intervals, and an adhesive having a predetermined elastic modulus and/or a predetermined modulus may fill spaces between the sub-thin film encapsulation layers 324b-1, 324b-2, and 324b-3. The sub-thin film encapsulation layers 324b-1, 324b-2, and 324b-3 may be formed to encapsulate one or more pixels arranged along the bending axis (e.g., R of FIG. 4). Accordingly, when the second region 300b is deformed from a flat surface to a curved surface, stress applied to the thin film encapsulation layer 324b may be minimized, and occurrence of cracks may be prevented.

Preferably, the thin film encapsulation layer 324b may be located on a neutral plane on which the smallest tensile/compressive stress acts.

In the illustrated embodiment, the display panel 320 may include a plurality of light emitting elements 325. The plurality of light emitting elements 325 may form pixel arrays 322a and 322b. The plurality of light emitting elements 325 may be disposed between cathode electrode layers 323a and 323b and substrates 321a and 321b. The light emitting elements 325 may be electrically connected to anode electrodes 326 formed on the substrates 321a and 321b and cathode electrodes 323b-1, 323b-2, and 323b-3 formed under the thin film encapsulation layer 324a or inside the sub-thin film encapsulation layers 324b-1, 324b-2, and 324b-3.

In the illustrated embodiment, the plurality of anode electrodes 326 may be formed on the substrates 321a and 321b. The plurality of anode electrodes 326 may be electrically connected with the plurality of light emitting elements 325, respectively.

In the illustrated embodiment, in the first region, the cathode electrode layer 323a may be integrally formed so as to be connected with the plurality of light emitting elements 325. The cathode electrode layer 323a may be a common electrode for the plurality of light emitting elements 325. The cathode electrode layer 323a may be formed under the thin film encapsulation layer 324a.

In the illustrated embodiment, in the second region, the cathode electrode layer 323b may include the plurality of cathode electrodes 323b-1, 323b-2, and 323b-3. The plurality of cathode electrodes 323b-1, 323b-2, and 323b-3 included in the second region may be formed in substantially the same number as that of the sub-thin film encapsulation layers 324b-1, 324b-2, and 324b-3. The plurality of cathode electrodes 323b-1, 323b-2, and 323b-3 included in the second region 300b may extend in substantially the same direction as the extension direction of the sub-thin film encapsulation layers 324b-1, 324b-2, and 324b-3. The cathode electrodes 323b-1, 323b-2, and 323b-3 may be connected with the plurality of light emitting elements 325. Each of the cathode electrodes 323b-1, 323b-2, and 323b-3 may be a common electrode for the plurality of light emitting elements 325.

In various embodiments, in the second region 300b, the sub-thin film encapsulation layers 324b-1, 324b-2, and 324b-3 may extend in a second direction (e.g., the direction perpendicular to the first direction or the extension direction of the bending axis) and may contain the one or more light emitting elements 325 arranged in the second direction, the anode electrodes 326 connected with the light emitting elements 325, and the cathode electrodes 323b-1, 323b-2, and 323b-3. The plurality of anode electrodes 326 may be formed to be in one-to-one correspondence with the light emitting elements 325. The plurality of cathode electrodes 323b-1, 323b-2, and 323b-3 may be formed to correspond to the sub-thin film encapsulation layers. In some embodiments, the number of cathode electrode layers 323b-1, 323b-2, and 323b-3 included in the second region 300b may be larger than the number of sub-thin film encapsulation layers 324b-1, 324b-2, and 324b-3.

FIG. 7 is a plan view illustrating a pixel region formed by light emitting elements of the flexible display according to various embodiments. FIG. 7(a) is a plan view of the first region. FIG. 7(b) is a plan view of the second region.

In the illustrated embodiment, a plurality of light emitting elements (e.g., the light emitting elements 325 of FIG. 6) may form pixel regions. The pixel regions may form a pixel array (e.g., the pixel array 322 of FIG. 5).

In the illustrated embodiment, pixel regions included in the first region 300a may have a substantially square shape. The pixel regions included in the first region 300a may be formed such that a first side (a) and a second side (a') have substantially the same length.

In the illustrated embodiment, pixel regions included in the second region 300b may be formed in a substantially rectangular shape including a long side (b) and a short side (b'). The pixel regions may be formed such that the long side (b) extends in the second direction (direction □ in the drawing) (e.g., the direction parallel to the bending axis). The long sides (b) and the short sides (b') of the pixel regions included in the second region 300b may have different lengths.

In various embodiments, the lengths of the long sides (b) and the short sides (b') may be determined such that the areas of the pixel regions of the second region are the same as the areas of the pixel regions of the first region (aa'=bb'). Accordingly, in the first region 300a and the second region 300b, the opening ratio of the pixel array 322 (=(the entire area of the pixel array−the areas of the pixel regions)/the entire area of the pixel array) may remain constant. Thus, the resolutions of the first region 300a and the second region 300b may remain the same.

FIG. 8 is a view illustrating a pixel array and a thin film encapsulation layer of the flexible display according to various embodiments.

Display panels 320a and 320b may include pixel arrays including a plurality of light emitting elements 325 and thin film encapsulation layers 324a and 324b surrounding the pixel arrays.

Referring to FIG. 8(a), the thin film encapsulation layer 324a included in the first region 300a may be integrally formed to include the plurality of light emitting elements 325 inside. The thin film encapsulation layer 324b included in the second region 300b may include a plurality of sub-encapsulation members 3241. Each of the plurality of sub-encapsulation members 3241 may include one light emitting element 325 inside.

Referring to FIG. 8(b), the thin film encapsulation layer 320a included in the first region 300a may be integrally formed to include the plurality of light emitting elements 325 inside. The thin film encapsulation layer 324b included in the second region 300b may include a plurality of sub-thin film encapsulation layers 324b-1, 324b-2, and 324b-3. Each of the plurality of sub-thin film encapsulation layers 324b-1, 324b-2, and 324b-3 may include one or more light emitting elements 325 inside. The plurality of sub-thin film encapsulation layers 324b-1, 324b-2, and 324b-3 may extend in the direction (e.g., the second direction) parallel to the bending axis of the second region 300b. Furthermore, the light emitting elements 325 may be disposed inside the sub-thin film encapsulation layers 324b-1, 324b-2, and 324b-3 such that long sides extend in the direction parallel to the bending axis.

FIG. 9 is a view illustrating pressure sensor arrays of the flexible display according to various embodiments.

In the illustrated embodiment, the flexible display 300 may further include the pressure sensor arrays 380a and 380b disposed under a base film (e.g., the base film 310 of FIG. 5). The pressure sensor arrays 380a and 380b may include wiring for electrically connecting a plurality of pressure sensors 384 and a pressure sensor 384. The pressure sensor array 382 may sense pressure applied to the second region 300b of the flexible display 300. For example, the pressure may be pressure that a multi-bar (e.g., the multi-bar 262 of FIG. 4) applies to the pressure sensor 384. A region making contact with the multi-bar (e.g., the multi-bar 262 of FIG. 4) may be determined based on the pressure. A current state (e.g., a closed state or an open state) of the flexible display 300 may be determined based on the pressure.

In the illustrated embodiment, first grooves 383 formed parallel to the second direction and second grooves 385 formed parallel to the first direction may be formed on the pressure sensor array 380b included in the second region 300b. The first direction may be the extension direction of the flexible display 300, and the second direction may be the direction parallel to the bending axis (e.g., R of FIG. 4) of the flexible display 300. The grooves 383 and 385 may distribute stress acting on the pressure sensor array 380b when the flexible display 300 is bent.

FIG. 10 is a view illustrating the flexible display and an electronic device according to various embodiments.

In various embodiments, the flexible display 300 may be coupled to the electronic device so as to be movable. At least part of the flexible display 300 may be formed of a curved surface or a flat surface depending on a state change (an open state or a closed state) of the electronic device.

In various embodiments, the cover layer 350 may be coupled to a first surface of the flexible display 300, and a cushion layer 370 may be coupled to a second surface of the flexible display 300. The cover layer 350 and the cushion layer 370 may have a greater width than the flexible display 300. The width of the flexible display 300 may be the length of the flexible display 300 in the second direction.

In various embodiments, at least part of the flexible display 300 may be slidably coupled to side structures 390 of the electronic device. The flexible display 300 may be disposed inward of the side structures 390 facing each other. The side structures 390 may further include guide portions 392 protruding toward the flexible display 300. The guide portions 392 may be disposed between the periphery of the cover layer 350 and the periphery of the cushion layer 370.

In various embodiments, the cushion layer 370 may include a plurality of wires 372 and 374. The plurality of wires 372 and 374 may include the first wires 372 extending in the first direction and the second wires 374 extending in the second direction. The first wires 372 may be formed along the periphery of the cushion layer 370. In some embodiments, the first wires 372 may include a ground region.

In various embodiments, the first wires 372 may include protruding portions 373 protruding toward the guide portions. The protruding portions 373 may be formed to be brought into contact with the guide portions 392 of the side structures 390.

In various embodiments, the second wires 374 may extend in a direction (e.g., the second direction) parallel to the bending axis. Accordingly, stress may not act on the second wires 374 when the flexible display 300 is bent. The protruding portions 373 of the first wires 372 may be brought into contact with the guide portions 392 of the side structures 390 when the flexible display 300 slides. Accordingly, the flexible display 300 may be grounded to the electronic device even when the flexible display 300 is bent or slides.

FIG. 11 is a view illustrating a flexible display according to various embodiments.

Referring to FIG. 11, the flexible display 500 may include a first region 500a and a second region 500b. Here, the first region 500a may be referred to as the first region 300a described above with reference to FIG. 4, and the second region 500b may be referred to as the second region 300b described above with reference to FIG. 4.

In the illustrated embodiment, the second region 500b of the flexible display 500 may include region 2-1 500b-1 formed on one side of the first region 500a and region 2-2 500b-2 formed on an opposite side of the first region 500a.

In various embodiments, the flexible display 500 or an electronic device including the same may include a completely flat state in which the entire second regions 500b-1 and 500b-2 are formed of the same plane as the first region 500a and a rolled state in which parts of the second regions 500b-1 and 500b-2 are formed of the same plane as the first region 500a. The rolled state may include a completely rolled state in which the areas of the second regions 500b-1 and 500b-2 that form the same plane are smallest. In some embodiments, the completely flat state may include a state in which curved surfaces included in the second regions 500b-1 and 500b-2 have the smallest area.

In various embodiments, region 2-1 500b-1 and region 2-2 500b-2 may be independently deformed when the flexible display 500 moves from the completely rolled state to the completely flat state, or vice versa. For example, region 2-1 500b-1 and region 2-2 500b-2 may be simultaneously or sequentially deformed.

FIG. 12 is a block diagram of an electronic device including a flexible display according to various embodiments.

Referring to FIG. 12, the electronic device 400 according to various embodiments may further include the display driver IC 420 configured to drive the flexible display (e.g., the flexible display 300 of FIGS. 4 to 10), the processor 410 configured to control the display driver IC 420, pressure sensors 430 included in the flexible display, and a memory 440.

In various embodiments, the plurality of pressure sensors 430 may form a sensor array (e.g., the sensor arrays 380a and 380b of FIG. 9). The pressure sensors 430 may be electrically connected with the processor 410 to transmit and receive signals. For example, the pressure sensors 430 may sense pressure acting on the flexible display and may transmit the detected signal to the processor. The processor 410 may detect the pressure acting on the flexible display, based on the signal sensed by the pressure sensors. Accordingly, the processor 410 may determine the state (e.g., an open state or a closed state) or the position (e.g., inside the electronic device or on a surface of the electronic device) of the flexible display 300.

In various embodiments, when the processor 410 determines that the electronic device is in an open state or a second region is located on a surface of the electronic device, the processor 410 may control the display driver IC 420 to operate a pixel array (e.g., the pixel array 322 of FIG. 5) and a touch sensor layer (e.g., the touch sensor layer 330 of FIG. 5) of the second region (e.g., the second region 300*b* of FIG. 5). Accordingly, a screen may be displayed on the second region (e.g., the second region 300*b* of FIG. 5).

In various embodiments, when the processor 410 determines that the electronic device is in a closed state or the second region is located inside the electronic device, the processor 410 may control the display driver IC 420 to stop operating the pixel array (e.g., the pixel array 322 of FIG. 5) and the touch sensor layer (e.g., the touch sensor layer 330 of FIG. 5) of the second region (e.g., the second region 300*b* of FIG. 5). For example, power may not be supplied to the second region (e.g., the second region 300*b* of FIG. 5). Accordingly, a malfunction by an unnecessary touch input may be prevented, and battery consumption may be prevented.

In various embodiments, the processor 410 may be configured to execute the instruction stored in the memory 440. The memory 440 may be implemented with a volatile or non-volatile memory.

FIG. 13 is a block diagram illustrating an electronic device 1301 in a network environment 1300 according to various embodiments. Referring to FIG. 13, the electronic device 1301 in the network environment 1300 may communicate with an electronic device 1302 via a first network 1398 (e.g., a short-range wireless communication network), or an electronic device 1304 or a server 1308 via a second network 1399 (e.g., a long-range wireless communication network). According to an embodiment, the electronic device 1301 may communicate with the electronic device 1304 via the server 1308. According to an embodiment, the electronic device 1301 may include a processor 1320, memory 1330, an input device 1350, a sound output device 1355, a display device 1360, an audio module 1370, a sensor module 1376, an interface 1377, a haptic module 1379, a camera module 1380, a power management module 1388, a battery 1389, a communication module 1390, a subscriber identification module (SIM) 1396, or an antenna module 1397. In some embodiments, at least one (e.g., the display device 1360 or the camera module 1380) of the components may be omitted from the electronic device 1301, or one or more other components may be added in the electronic device 1301. In some embodiments, some of the components may be implemented as single integrated circuitry. For example, the sensor module 1376 (e.g., a fingerprint sensor, an iris sensor, or an illuminance sensor) may be implemented as embedded in the display device 1360 (e.g., a display).

The processor 1320 may execute, for example, software (e.g., a program 1340) to control at least one other component (e.g., a hardware or software component) of the electronic device 1301 coupled with the processor 1320, and may perform various data processing or computation. According to one embodiment, as at least part of the data processing or computation, the processor 1320 may load a command or data received from another component (e.g., the sensor module 1376 or the communication module 1390) in volatile memory 1332, process the command or the data stored in the volatile memory 1332, and store resulting data in non-volatile memory 1334. According to an embodiment, the processor 1320 may include a main processor 1321 (e.g., a central processing unit (CPU) or an application processor (AP)), and an auxiliary processor 1323 (e.g., a graphics processing unit (GPU), an image signal processor (ISP), a sensor hub processor, or a communication processor (CP)) that is operable independently from, or in conjunction with, the main processor 1321. Additionally or alternatively, the auxiliary processor 1323 may be adapted to consume less power than the main processor 1321, or to be specific to a specified function. The auxiliary processor 1323 may be implemented as separate from, or as part of the main processor 1321.

The auxiliary processor 1323 may control at least some of functions or states related to at least one component (e.g., the display device 1360, the sensor module 1376, or the communication module 1390) among the components of the electronic device 1301, instead of the main processor 1321 while the main processor 1321 is in an inactive (e.g., sleep) state, or together with the main processor 1321 while the main processor 1321 is in an active state (e.g., executing an application). According to an embodiment, the auxiliary processor 1323 (e.g., an image signal processor or a communication processor) may be implemented as part of another component (e.g., the camera module 1380 or the communication module 1390) functionally related to the auxiliary processor 1323.

The memory 1330 may store various data used by at least one component (e.g., the processor 1320 or the sensor module 1376) of the electronic device 1301. The various data may include, for example, software (e.g., the program 1340) and input data or output data for a command related thereto. The memory 1330 may include the volatile memory 1332 or the non-volatile memory 1334.

The program 1340 may be stored in the memory 1330 as software, and may include, for example, an operating system (OS) 1342, middleware 1344, or an application 1346.

The input device 1350 may receive a command or data to be used by other component (e.g., the processor 1320) of the electronic device 1301, from the outside (e.g., a user) of the electronic device 1301. The input device 1350 may include, for example, a microphone, a mouse, a keyboard, or a digital pen (e.g., a stylus pen).

The sound output device 1355 may output sound signals to the outside of the electronic device 1301. The sound output device 1355 may include, for example, a speaker or a receiver. The speaker may be used for general purposes, such as playing multimedia or playing record, and the receiver may be used for an incoming calls. According to an embodiment, the receiver may be implemented as separate from, or as part of the speaker.

The display device 1360 may visually provide information to the outside (e.g., a user) of the electronic device 1301. The display device 1360 may include, for example, a display, a hologram device, or a projector and control circuitry to control a corresponding one of the display, hologram device, and projector. According to an embodiment, the display device 1360 may include touch circuitry adapted to detect a touch, or sensor circuitry (e.g., a pressure sensor) adapted to measure the intensity of force incurred by the touch.

The audio module 1370 may convert a sound into an electrical signal and vice versa. According to an embodiment, the audio module 1370 may obtain the sound via the input device 1350, or output the sound via the sound output device 1355 or a headphone of an external electronic device (e.g., an electronic device 1302) directly (e.g., wiredly) or wirelessly coupled with the electronic device 1301.

The sensor module 1376 may detect an operational state (e.g., power or temperature) of the electronic device 1301 or an environmental state (e.g., a state of a user) external to the electronic device 1301, and then generate an electrical signal or data value corresponding to the detected state. According to an embodiment, the sensor module 1376 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 1377 may support one or more specified protocols to be used for the electronic device 1301 to be coupled with the external electronic device (e.g., the electronic device 1302) directly (e.g., wiredly) or wirelessly. According to an embodiment, the interface 1377 may include, for example, a high definition multimedia interface (HDMI), a universal serial bus (USB) interface, a secure digital (SD) card interface, or an audio interface.

A connecting terminal 1378 may include a connector via which the electronic device 1301 may be physically connected with the external electronic device (e.g., the electronic device 1302). According to an embodiment, the connecting terminal 1378 may include, for example, a HDMI connector, a USB connector, a SD card connector, or an audio connector (e.g., a headphone connector).

The haptic module 1379 may convert an electrical signal into a mechanical stimulus (e.g., a vibration or a movement) or electrical stimulus which may be recognized by a user via his tactile sensation or kinesthetic sensation. According to an embodiment, the haptic module 1379 may include, for example, a motor, a piezoelectric element, or an electric stimulator.

The camera module 1380 may capture a still image or moving images. According to an embodiment, the camera module 1380 may include one or more lenses, image sensors, image signal processors, or flashes.

The power management module 1388 may manage power supplied to the electronic device 1301. According to one embodiment, the power management module 1388 may be implemented as at least part of, for example, a power management integrated circuit (PMIC).

The battery 1389 may supply power to at least one component of the electronic device 1301. According to an embodiment, the battery 1389 may include, for example, a primary cell which is not rechargeable, a secondary cell which is rechargeable, or a fuel cell.

The communication module 1390 may support establishing a direct (e.g., wired) communication channel or a wireless communication channel between the electronic device 1301 and the external electronic device (e.g., the electronic device 1302, the electronic device 1304, or the server 1308) and performing communication via the established communication channel. The communication module 1390 may include one or more communication processors that are operable independently from the processor 1320 (e.g., the application processor (AP)) and supports a direct (e.g., wired) communication or a wireless communication. According to an embodiment, the communication module 1390 may include a wireless communication module 1392 (e.g., a cellular communication module, a short-range wireless communication module, or a global navigation satellite system (GNSS) communication module) or a wired communication module 1394 (e.g., a local area network (LAN) communication module or a power line communication (PLC) module). A corresponding one of these communication modules may communicate with the external electronic device via the first network 1398 (e.g., a short-range communication network, such as Bluetooth™, wireless-fidelity (Wi-Fi) direct, or infrared data association (IrDA)) or the second network 1399 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 1392 may identify and authenticate the electronic device 1301 in a communication network, such as the first network 1398 or the second network 1399, using subscriber information (e.g., international mobile subscriber identity (IMSI)) stored in the subscriber identification module 1396.

The antenna module 1397 may transmit or receive a signal or power to or from the outside (e.g., the external electronic device) of the electronic device 1301. According to an embodiment, the antenna module 1397 may include an antenna including a radiating element composed of a conductive material or a conductive pattern formed in or on a substrate (e.g., PCB). According to an embodiment, the antenna module 1397 may include a plurality of antennas. In such a case, at least one antenna appropriate for a communication scheme used in the communication network, such as the first network 1398 or the second network 1399, may be selected, for example, by the communication module 1390 (e.g., the wireless communication module 1392) from the plurality of antennas. The signal or the power may then be transmitted or received between the communication module 1390 and the external electronic device via the selected at least one antenna. According to an embodiment, another component (e.g., a radio frequency integrated circuit (RFIC)) other than the radiating element may be additionally formed as part of the antenna module 1397.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 1301 and the external electronic device 1304 via the server 1308 coupled with the second network 1399. Each of the electronic devices 1302 and 1304 may be a device of a same type as, or a different type, from the electronic device 1301. According to an embodiment, all or some of operations to be executed at the electronic device 1301 may be executed at one or more of the external electronic devices 1302, 1304, or 1308. For example, if the electronic device 1301 should perform a function or a service automatically, or in response to a request from a user or another device, the electronic device 1301, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 1301. The electronic device 1301 may provide the outcome, with or without further processing of the outcome, as at least part of a reply to the request. To that end, a cloud computing, distributed computing, or client-server computing technology may be used, for example.

FIG. 14 is a block diagram 1400 illustrating the display device 1360 according to various embodiments. Referring to FIG. 14, the display device 1360 may include a display 1410 and a display driver integrated circuit (DDI) 1430 to control the display 1410. The DDI 1430 may include an interface module 1431, memory 1433 (e.g., buffer memory), an image processing module 1435, or a mapping module 1437. The DDI 1430 may receive image information that contains image data or an image control signal corresponding to a command to control the image data from another component of the electronic device 1301 via the interface module 1431. For example, according to an embodiment, the image information may be received from the processor 1320 (e.g., the main processor 1321 (e.g., an application processor)) or the auxiliary processor 1323 (e.g., a graphics processing unit) operated independently from the function of the main processor 1321. The DDI 1430 may communicate, for example, with touch circuitry 1350 or the sensor module 1376 via the interface module 1431. The DDI 1430 may also store at least part of the received image information in the memory 1433, for example, on a frame by frame basis. The image processing module 1435 may perform pre-processing or post-processing (e.g., adjustment of resolution, brightness, or size) with respect to at least part of the image data. According to an embodiment, the pre-processing or post-processing may be performed, for example, based at least in part on one or more characteristics of the image data or one or more characteristics of the display 1410. The mapping module 1437 may generate a voltage value or a current value corresponding to the image data pre-processed or post-processed by the image processing module 1435. According to an embodiment, the generating of the voltage value or current value may be performed, for example, based at least in part on one or more attributes of the pixels (e.g., an array, such as an RGB stripe or a pentile structure, of the pixels, or the size of each subpixel). At least some pixels of the display 1410 may be driven, for example, based at least in part on the voltage value or the current value such that visual information (e.g., a text, an image, or an icon) corresponding to the image data may be displayed via the display 1410.

According to an embodiment, the display device 1360 may further include the touch circuitry 1450. The touch circuitry 1450 may include a touch sensor 1451 and a touch sensor IC 1453 to control the touch sensor 1451. The touch sensor IC 1453 may control the touch sensor 1451 to sense a touch input or a hovering input with respect to a certain position on the display 1410. To achieve this, for example, the touch sensor 1451 may detect (e.g., measure) a change in a signal (e.g., a voltage, a quantity of light, a resistance, or a quantity of one or more electric charges) corresponding to the certain position on the display 1410. The touch circuitry 1450 may provide input information (e.g., a position, an area, a pressure, or a time) indicative of the touch input or the hovering input detected via the touch sensor 1451 to the processor 1320. According to an embodiment, at least part (e.g., the touch sensor IC 1453) of the touch circuitry 1450 may be formed as part of the display 1410 or the DDI 1430, or as part of another component (e.g., the auxiliary processor 1323) disposed outside the display device 1360.

According to an embodiment, the display device 1360 may further include at least one sensor (e.g., a fingerprint sensor, an iris sensor, a pressure sensor, or an illuminance sensor) of the sensor module 1376 or a control circuit for the at least one sensor. In such a case, the at least one sensor or the control circuit for the at least one sensor may be embedded in one portion of a component (e.g., the display 1410, the DDI 1430, or the touch circuitry 1350)) of the display device 1360. For example, when the sensor module 1376 embedded in the display device 1360 includes a biometric sensor (e.g., a fingerprint sensor), the biometric sensor may obtain biometric information (e.g., a fingerprint image) corresponding to a touch input received via a portion of the display 1410. As another example, when the sensor module 1376 embedded in the display device 1360 includes a pressure sensor, the pressure sensor may obtain pressure information corresponding to a touch input received via a partial or whole area of the display 1410. According to an embodiment, the touch sensor 1451 or the sensor module 1376 may be disposed between pixels in a pixel layer of the display 1410, or over or under the pixel layer.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 1340) including one or more instructions that are stored in a storage medium (e.g., internal memory 1336 or external memory 1338) that is readable by a machine (e.g., the electronic device 1301). For example, a processor (e.g., the processor 1320) of the machine (e.g., the electronic device 1301) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a compiler or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

The invention claimed is:

1. An electronic device comprising:
   a flexible display including a plurality of layers; and
   a first housing structure and a second housing structure having the flexible display mounted thereon, the second housing structure coupled to the first housing structure and configured to slide in a first direction with respect to the first housing structure,
   wherein the flexible display includes:
   a first region; and
   a second region extending from the first region in the first direction, wherein the second region has a higher flexibility,
   wherein at least one of the plurality of layers has a first structure in the first region and has a second structure different from the first structure in the second region, and
   wherein the first region of the flexible display is supported by the first housing structure and the second housing structure and is configured to remain flat, and at least part of the second region of the flexible display is configured to be curved and configured to be flat based on a sliding of the second housing structure, and
   wherein the plurality of layers includes a display panel and a base film disposed in the first region and the second region and disposed under the display panel,
   wherein the base film includes a flexible film having grooves in an area corresponding to the second region, and
   wherein the display panel is disposed in the first region and the second region,
   wherein the display panel includes a first plurality of light emitting elements that are disposed in the first region and a second plurality of light emitting elements that are disposed in the second region,
   wherein the display panel further includes a thin film encapsulation layer disposed in the first region and the second region, and
   wherein the thin film encapsulation layer in the second region divides the second plurality of light emitting elements into more divisions than the thin film encapsulation layer divides the first plurality of light emitting elements.

2. The electronic device of claim 1, wherein at least another part of the second region is curved.

3. The electronic device of claim 1, wherein the first plurality of light emitting elements have substantially a same area and different dimensions from the second plurality of light emitting elements.

4. The electronic device of claim 1, wherein at least one of the plurality of layers includes a polymer film disposed in the first region and the second region.

5. The electronic device of claim 1, wherein the base film included in the second region includes a pattern extending in a second direction perpendicular to the first direction, the pattern defined by the grooves.

6. The electronic device of claim 5, wherein the plurality of layers includes a pressure sensor array disposed on the base film, and wherein the grooves of the base film are configured to divide the pressure sensor array.

7. The electronic device of claim 1, wherein a first portion and a second portion of the thin film encapsulation layer are spaced apart from each other.

8. The electronic device of claim 7, wherein an adhesive composition fills a space between the first portion and the second portion.

9. The electronic device of claim 1, wherein a first portion or a second portion of the thin film encapsulation layer extends in a second direction perpendicular to the first direction.

10. The electronic device of claim 1, wherein each of the first plurality of light emitting elements and second plurality of light elements include an anode electrode, a cathode electrode disposed on the anode electrode, and an organic light emitting material formed between the anode electrode and the cathode electrode, and
    wherein at least part of the cathode electrode is disposed inside a first portion or a second portion of the thin film encapsulation layer.

11. The electronic device of claim 1, wherein the plurality of layers includes a touch sensor layer including a plurality of touch sensors and a first wire configured to electrically connect the plurality of touch sensors, wherein on the display panel, the touch sensor layer extends in the first region and the second region, wherein the first wire includes a first portion disposed in the first region and a second portion disposed in the second region, and wherein the second portion of the first wire is formed in a pattern having a different shape from the first portion.

12. The electronic device of claim 11, wherein the second portion of the first wire is formed in a zigzag pattern.

13. The electronic device of claim 1, wherein the plurality of layers include a cover window configured to form a surface of the electronic device, wherein the cover window includes a first portion disposed in the first region and a second portion disposed in the second region, and wherein the first portion includes a first cover window and a second cover window.

14. The electronic device of claim 1, wherein the base film comprises a cushion layer or an embo layer.

15. The electronic device of claim 1, wherein the flexible film includes polyimide.

\* \* \* \* \*